United States Patent
Kamiguchi et al.

(10) Patent No.: US 7,542,248 B2
(45) Date of Patent: Jun. 2, 2009

(54) MAGNETORESISTANCE EFFECT ELEMENT, MAGNETIC HEAD AND MAGNETIC RECORDING AND/OR REPRODUCING SYSTEM

(75) Inventors: Yuuzo Kamiguchi, Yokohama (JP);
Hiromi Yuasa, Yokohama (JP);
Tomohiko Nagata, Yokohama (JP);
Hiroaki Yoda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/984,865

(22) Filed: Nov. 23, 2007

(65) Prior Publication Data
US 2008/0088981 A1 Apr. 17, 2008

Related U.S. Application Data

(63) Continuation of application No. 10/970,278, filed on Oct. 22, 2004, now Pat. No. 7,359,162, which is a continuation of application No. 09/947,355, filed on Sep. 7, 2001, now abandoned.

(30) Foreign Application Priority Data

Sep. 11, 2000 (JP) ............................. 2000-275417

(51) Int. Cl.
G11B 5/39 (2006.01)
(52) U.S. Cl. ............................. 360/324.11; 360/324.12; 338/32 R
(58) Field of Classification Search ............ 360/324.11, 360/324.12; 324/207.22, 207.21, 252; 338/32 R
See application file for complete search history.

(56) References Cited

U.S. PATENT DOCUMENTS

| | | | |
|---|---|---|---|
| 5,304,975 A | 4/1994 | Saito et al. | |
| 5,313,186 A | 5/1994 | Schuhl et al. | |
| 5,448,515 A | 9/1995 | Fukami et al. | |
| 5,459,687 A | 10/1995 | Sakakima et al. | |
| 5,549,978 A | 8/1996 | Iwasaki et al. | |

(Continued)

FOREIGN PATENT DOCUMENTS

JP 6-326374 11/1994

(Continued)

OTHER PUBLICATIONS

JP 11-168249, Sato et al, Jun. 22, 1999; partial English machine translation only.*

(Continued)

*Primary Examiner*—Brian E Miller
(74) *Attorney, Agent, or Firm*—Oblon, Spivak, McClelland, Maier & Neustadt, P.C.

(57) ABSTRACT

There is provided a practical magnetoresistance effect element which has an appropriate value of resistance, which can be sensitized and which has a small number of magnetic layers to be controlled, and a magnetic head and magnetic recording and/or reproducing system using the same. In a magnetoresistance effect element wherein a sense current is caused to flow in a direction perpendicular to the plane of the film, if a pinned layer and a free layer have a stacked construction of a magnetic layer and a non-magnetic layer or a stacked construction of a magnetic layer and a magnetic layer, it is possible to provide a practical magnetoresistance effect element which has an appropriate value of resistance, which can be sensitized and which has a small number of magnetic layers, while effectively utilizing the scattering effect depending on spin.

6 Claims, 20 Drawing Sheets

U.S. PATENT DOCUMENTS

| | | | |
|---|---|---|---|
| 5,617,071 A * | 4/1997 | Daughton | 338/32 R |
| 5,768,181 A | 6/1998 | Zhu et al. | |
| 5,768,183 A | 6/1998 | Zhu et al. | |
| 5,880,911 A | 3/1999 | Ishihara et al. | |
| 5,936,402 A * | 8/1999 | Schep et al. | 324/252 |
| 6,002,553 A | 12/1999 | Stearns et al. | |
| 6,137,662 A | 10/2000 | Huai et al. | |
| 6,205,008 B1 | 3/2001 | Gijs et al. | |
| 6,400,537 B2 | 6/2002 | Sakakima et al. | |
| 6,473,275 B1 | 10/2002 | Gill | |
| 6,522,507 B1 | 2/2003 | Horng et al. | |
| 6,603,642 B1 | 8/2003 | Araki et al. | |
| 6,636,391 B2 | 10/2003 | Watanabe et al. | |
| 2001/0004307 A1 * | 6/2001 | Saito et al. | 360/324.12 |
| 2002/0073785 A1 | 6/2002 | Prakash et al. | |
| 2003/0035256 A1 | 2/2003 | Hayashi et al. | |

FOREIGN PATENT DOCUMENTS

| | | |
|---|---|---|
| JP | 11-168249 | 6/1999 |
| JP | 2000-67418 | 3/2000 |
| JP | 2000-188435 | 7/2000 |
| JP | 2000-21414 | 8/2000 |

OTHER PUBLICATIONS

S. Sanvito, et al., "Breakdown of the Resistor Model of CPP-GMR in Magnetic Multilayered Nanostructures", Physical Review B, vol. 61, No. 20, May 15, 2000, pp. 14225-14228.

Didier Bozec, et al., "Mean Free Path Effects on the Current Perpendicular to the Plane Magnetoresistance of Magnetic Multilayers", Physical Review Letters, vol. 85, No. 6, Aug. 7, 2000, pp. 1314-1317.

B. Dieny, et al., "Magnetotransport Properties of Magnetically Soft Spin-Valve Structures (Invited)", J. Appl. Phys., vol. 69 (8), Apr. 115, 1991, pp. 4774-4779.

B. Dieny, et al., "Giant Magnetoresistance of Magnetically Soft Sandwiches: Dependence on Temperature and on Layer Thicknesses", Physical Review B, vol. 45, No. 2, Jan. 1, 1992, pp. 806-813.

D. Bozec, et al., Comparative Study of the Magnetoresistance of MBE-Grown Multilayers: [Fe/Cu/Co/Cu]N and Fe/Cu]N[Co/Cu]N, Physical Review B, vol. 60, No. 5, Aug. 1, 1999, pp. 3037-3039.

* cited by examiner

MAGNETORESISTANCE EFFECT ELEMENT, MAGNETIC HEAD AND MAGNETIC RECORDING AND/OR REPRODUCING SYSTEM

CROSS REFERENCE TO RELATED APPLICATION

This application is based upon and claims benefit of priority from the prior Japanese Patent Application No. 2000-275417, filed on Sep. 11, 2000; and from the patent application with the Ser. No. 09/947,355 that was filed on Sep. 7, 2001, and the patent application with the Ser. No. 10/970,278 filed on Oct. 22, 2004; the entire contents of which are incorporated herein by reference.

BACKGROUND OF THE INVENTION

1. Field of the Invention

The present invention relates generally to a magnetoresistance effect element, a magnetic head and a magnetic recording and/or reproducing system. More specifically, the invention relates to a magnetoresistance effect element using a spin-valve film wherein a sense current flows in a direction perpendicular to the plane of the thin film, a magnetic head including the magnetoresistance effect element, and a magnetic recording and/or reproducing system including the magnetoresistance effect element.

2. Description of Related Art

There is known a phenomenon that an electric resistance varies in response to an external magnetic field in a certain kind of ferromagnetic material. This is called a "magnetoresistance effect". This effect can be used for detecting an external magnetic field, and such a magnetic field detecting element is called a "magnetoresistance effect element (which will be hereinafter referred to as an "MR element")".

Such an MR element is industrially utilized for reading information, which has been stored in a magnetic recording medium, in a magnetic recording and/or reproducing system, such as a hard disk or a magnetic tape (see IEEE MAG-7, 150 (1971)), and such a magnetic head is called an "MR head".

By the way, in recent years, in magnetic recording and/or reproducing systems utilizing such an MR element, particularly in hard disk drives, the magnetic recording density is being enhanced, and the size of one bit is decreasing, so that the amount of leakage flux from a bit is increasingly decreased. For that reason, it is necessary to prepare an MR element, which has a high sensitivity and a high S/N ratio and which can obtain a high rate of change in resistance even in a lower magnetic field, in order to read information which has been written in a magnetic medium, and this is an important basic technique for improving the recording density.

The "high sensitivity" means that the amount of change in resistance ($\Omega$) per a unit magnetic field (Oe) is large. As an MR element has a larger amount of change in MR and a more excellent magnetically soft characteristic, the MR element has a higher sensitivity. In addition, in order to realize a high S/N ratio, it is important to reduce thermal noises. Therefore, it is not desired that the resistance itself of the element is too high, and when the element is used as a reading sensor for a hard disk, the resistance of the element is preferably in the range of from about 5$\Omega$ to about 30$\Omega$ in order to realize a good S/N ratio.

Under such a background, at present, a spin-valve film capable of obtaining a high rate of change in MR is generally used as an MR element for use in a hard disk MR head.

FIG. 19 is a conceptual drawing showing an example of a schematic cross-sectional structure of a spin-valve film. The spin-valve film 100 has a structure wherein a ferromagnetic layer F, a non-magnetic layer S, a ferromagnetic layer P and an antiferromagnetic layer A are stacked in that order. Of the two ferromagnetic layers F and P which are magnetically in a non-coupled state via the non-magnetic layer S, the magnetization of one ferromagnetic layer P is fixed by an exchange bias or the like using the antiferromagnetic material, and the magnetization of the other ferromagnetic layer F is set to be capable of being easily rotated by an external magnetic field (a signal magnetic field or the like). Then, only the magnetization of the ferromagnetic layer F can be rotated by the external magnetic field to change a relative angle between the magnetization directions of the two ferromagnetic layers P and F to obtain a large magnetoresistance effect (see Phys. Rev. B45, 806 (1992), J. Appl. Phys. 69, 4774 (1991)).

The ferromagnetic layer F is often called a "free layer", a "magnetic field receiving layer", or a "magnetization free layer". The ferromagnetic layer P is often called a "pinned layer" or a "magnetization fixed layer". The non-magnetic layer S is often called a "spacer layer", a "non-magnetic intermediate layer" or an "intermediate layer".

The spin-valve film can rotate the magnetization of the free layer, i.e., the ferromagnetic layer F. Therefore, the spin-valve film can be sensitized, so that it is suitable for an MR element for use in an MR head.

It is required to cause a "sense current" to flow through such a spin-valve element in order to detect the variation in resistance due to a magnetic field.

FIG. 20 is a conceptual drawing showing a generally used current supply system. That is, at present, there is generally used a system for providing electrodes EL, EL on both ends of a spin-valve element as shown in the figure to cause a sense current I to flow in parallel to the plane of the film to measure a resistance in a direction parallel to the plane of the film. This method is generally called a "current-in-plane (CIP)" system.

In the case of the CIP system, it is possible to obtain a value of about 10 to 20% as a rate of change in MR. In a shield-type MR head which is generally used at present, a spin-valve element has a substantially square shape, so that the resistance of an MR element is substantially equal to a value of plane electric resistance (sheet resistance) of an MR film. Therefore, a spin-valve film of a CIP system can obtain good S/N characteristics if the value of plane electric resistance is set to be 10 to 30$\Omega$. This can be relatively simply realized by decreasing the thickness of the whole spin-valve film. Because of these advantages, the spin-valve film of the CIP system is generally used as an MR element for an MR head at present.

However, it is expected that the rate of change in MR is required to exceed 30% in order to realize information reproduction at a high recording density exceeding 100 Gbit/inch$^2$. On the other hand, it is difficult to obtain a value exceeding 20% as the rate of change in MR in conventional spin-valve films. For that reason, in order to further improve a recording density, it is a great technical theme to increase the rate of change in MR.

From such a point of view, in order to increase the rate of change in MR, there is proposed a spin-valve comprising a magnetic/non-magnetic layer stacked film wherein a pinned layer and a free layer are ferromagnetically coupled in a CIP-spin-valve (CIP-SV) film.

FIG. 21 is a schematic sectional view of a spin-valve film having such a stacked structure. That is, each of a pinned layer P and a free layer F has the stacked structure of a ferromagnetic layer and a non-magnetic layer. In the case of this structure, the scattering of electrons depending on spin in the magnetic layer/non-magnetic layer interface in the spin-valve film contributes to the MR effect. Therefore, if the number of the magnetic layer/non-magnetic layer interface between the pinned layer P and the free layer F is increased so that a larger number of conduction electrons pass through the magnetic layer/non-magnetic layer interface, it is possible to obtain a high rate of change in MR.

However, in the construction of FIG. 21, since the sense current I flows in parallel to the stacked structure although the number of interfaces increases, there is a strong probability that each of electrons will flow through any one of the layers, so that the number of electrons crossing the interface can not be so increased. Therefore, it is difficult to improve the high rate of change in resistance.

In addition, in the above described method, since the total thickness of the film increases by the non-magnetic layers which are stacked on the pinned layer P and free layer F, respectively, the value of resistance of the plane of the film, i.e., a so-called value of plane electric resistance (sheet resistance), greatly decreases, so that the value of change in resistance (=value of plane electric resistance×rate of change in MR) decreases. Since the output of the head is generally in proportion to the amount of change in resistance, there is also a problem in that the absolute value of the output decreases when it is actually used as a sensor.

For the above described reasons, also in the CIP-SV film having the multi-layer structure of pin and free layers shown in FIG. 21, it is substantially difficult to realize a high rate of change in MR exceeding 20% and a practical amount of chamber in resistance of 5 to 30Ω.

On the other hand, as a method for obtaining a large MR exceeding 30%, there is proposed a magnetoresistance effect element (which will be hereinafter referred to as a CPP-artificial lattice) of a type (current perpendicular to plane (CPP)) that a sense current is caused to flow in a direction perpendicular to the plane of the film in an artificial lattice wherein magnetic and non-magnetic materials are stacked.

FIG. 22 is a conceptual drawing showing a cross-sectional structure of a CPP-artificial lattice type element. In a magnetoresistance effect element of this type, electrodes EL are provided on the top and bottom face of an artificial lattice SL comprising ferromagnetic/non-magnetic layers, and a sense current I flows in a direction perpendicular to the plane of the film. It is known that this construction can a good interface effect and a high rate of change in MR since there is a strong probability that the current I will cross the magnetic layer/non-magnetic layer interface.

However, in such a CPP artificial lattice type element, it is required to measure the electric resistance of an artificial lattice SL having the stacked structure of very thin metallic films in a direction perpendicular to the plane of the film. However, this value of resistance is generally very small. Therefore, in the CPP artificial lattice, it is an important technical theme to increase the value of resistance. Conventionally, in order to increase this value, it is necessary to decreases the junction area between the artificial lattice SL and the electrode SL as small as possible and to increase the number of stacked layers of the artificial lattice SL to increase the total thickness of the film. For example, when the element is patterned so as to have a size of 0.1 μm×0.1 μm, if a Co layer having a thickness of 2 nm and a Cu layer having a thickness of 2 nm are alternately stacked ten times, the total thickness of the film is 20 nm, and a value of resistance of about 1Ω can be obtained.

For the above described reasons, in order that the CPP artificial lattice type film provides a sufficient head output to be used as a good reading sensor for a hard disk, it is necessary for the film to be the artificial lattice type, not the spin-valve type, from the standpoint of resistance.

However, when the MR element is used for an MR head, it is required to cause each of magnetic layers to be a single magnetic domain so as not to generate Barkhausen noises, while controlling the magnetization of the magnetic layer so that an external magnetic field can be efficiently measured. However, as described above, it is required to alternately stack many magnetic and non-magnetic layers in order to increase the value of resistance in the CPP-MR element, and it is technically very difficult to individually control the magnetization of such many magnetic layers.

In addition, when the MR element is used for an MR head, it is required to allow the magnetization against a small signal magnetic field to sensitively rotate to obtain a high rate of change in MR. For that purpose, it is required to improve the signal magnetic flux density at a sensing portion to obtain a large amount of rotation of magnetization even at the same magnetic flux density. Therefore, it is required to decrease the total Mst (magnetization×thickness) of layers wherein magnetization is rotated by an external magnetic field. However, in the CPP-MR element, it is required to alternately stack many magnetic and non-magnetic layers in order to increase the value of resistance. Therefore, Mst increases, so that it is difficult to improve the sensitivity to the signal magnetic flux.

For that reason, although it is expected that the CPP artificial lattice type film has a rate of change in MR exceeding 30%, it is difficult to sensitize the film in order to use the film as an MR sensor for a head, so that it is substantially impossible to use the film as the MR sensor.

On the other hand, it is considered that the spin-valve structure using FeMn/NiFe/Cu/NiFe, FeMn/CoFe/Cu/CoFe or the like adopts the CPP system.

FIG. 23 is a conceptual drawing showing a cross-sectional structure of a CPP-SV element. However, in such a CPP-SV construction, the thickness of a magnetic layer must be increased to about 20 nm in order to the value of resistance. Also in that case, it is predicted that the rate of change in resistance would be only about 30% at 4.2 K and about 15%, which is half thereof, at room temperatures.

That is, in the spin-valve film of the CPP system, the rate of change in MR is only about 15%, and the Mst of the free layer must be increased. Therefore, it is difficult to sensitize the film in order to use the film as an MR sensor for a head, so that it is substantially difficult to use the film.

As described above, although there are proposed various systems, such as the spin-valve film of the CIP system, the artificial lattice of the CPP system, and the spin-valve of the CPP system, it is difficult to realize a spin-valve film which can be used at a high packing density exceeding 100 Gbit/inch$^2$, which has an appropriate value of resistance and a large amount of change in MR and which is magnetically sensitive, at present.

SUMMARY OF THE INVENTION

It is therefore an object of the present invention to eliminate the aforementioned problems and to provide a practical magnetoresistance effect element which has an appropriate value of resistance, which can be sensitized and which has a small number of magnetic layers to be controlled, while effectively utilizing the scattering effect depending on spin, and a magnetic head and magnetic recording and/or reproducing system using the same.

In order to accomplish the aforementioned object, according to one aspect of the present invention, a magnetoresistance effect element comprises: a magnetization fixed layer in which the direction of magnetization is substantially fixed to one direction; a magnetization free layer in which the direction of magnetization varies in response to an external magnetic field; and a non-magnetic intermediate layer provided between the magnetization fixed layer and the magnetization free layer, at least one of the magnetization fixed layer and the magnetization free layer having a stacked body in which ferromagnetic layers and non-magnetic layers are alternately stacked, the non-magnetic layers in the stacked body being thinner than the non-magnetic intermediate layer, the resistance of the magnetoresistance effect element varying in response to a relative angle between the direction of magnetization of the magnetization fixed layer and the direction of magnetization of the magnetization free layer, and a sense current being applied to the magnetization fixed layer, the non-magnetic intermediate layer and the magnetization free layer in a direction substantially perpendicular to surfaces of those layers.

The ferromagnetic layers in the stacked body may be ferromagnetically coupled to each other.

At least one of the ferromagnetic layers included in the stacked body may include a layer of a first ferromagnetic material, and a layer of a second ferromagnetic material different from the first ferromagnetic material.

The stacked body may include the ferromagnetic layers of a first ferromagnetic material, and the ferromagnetic layers of a second ferromagnetic material different from the first ferromagnetic material.

The ferromagnetic layers included in the stacked body may contain any one of an iron (Fe) base alloy, a cobalt (Co) base alloy and a nickel (Ni) base alloy, and the non-magnetic layers included in the stacked body may contain any one of gold (Au), silver (Ag), copper (Cu), rhodium (Rh), ruthenium (Ru), manganese (Mn), chromium (Cr), rhenium (Re), osmium (Os), iridium (Ir), and an alloy containing any one of gold, silver, copper, rhodium, ruthenium, manganese, chromium, rhenium, osmium, and iridium.

Each of the magnetization fixed layer and the magnetization free layer may have the stacked body, and the stacked body of the magnetization fixed layer may have a different film structure from that of the stacked body of the magnetization free layer.

According to another aspect of the present invention, a magnetoresistance effect element comprises: a magnetization fixed layer in which the direction of magnetization is substantially fixed to one direction; a magnetization free layer in which the direction of magnetization varies in response to an external magnetic field; and a non-magnetic intermediate layer provided between the magnetization fixed layer and the magnetization free layer, at least one of the magnetization fixed layer and the magnetization free layer having a stacked body in which two kinds or more of ferromagnetic layers are stacked, the resistance of the magnetoresistance effect element varying in response to a relative angle between the direction of magnetization of the magnetization fixed layer and the direction of magnetization of the magnetization free layer, and a sense current for detecting the variation in the resistance being applied to the magnetization fixed layer, the non-magnetic intermediate layer and the magnetization free layer in a direction substantially perpendicular to surfaces of those layers.

In any one of the above described magnetoresistance effect elements, at least one of the ferromagnetic layers included in the stacked body may contain an iron (Fe) base alloy.

At least one of the ferromagnetic layers included in the stacked body may be formed of an alloy containing nickel (Ni), iron (Fe) or cobalt (Co).

Each of the magnetization fixed layer and the magnetization free layer may have the stacked body, and the stacking period in the stacked body of the magnetization fixed layer may be different from the stacking period in the stacked body of the magnetization free layer.

The non-magnetic intermediate layer may have a stacked body wherein two kinds or more of non-magnetic layers are stacked.

The two kinds or more of non-magnetic layers may include two kinds of non-magnetic layers, each of which contains two of gold (Au), silver (Ag), copper (Cu), rhodium (Rh), ruthenium (Re), manganese (Mn), chromium (Cr), rhenium (Re), osmium (Os) and iridium (Ir) as principal components.

Each of the magnetization fixed layer and the magnetization free layer may have the stacked body, and the stacked body of the magnetization fixed layer may have a different film structure from that of the stacked body of the magnetization free layer.

A magnetic head according to another aspect of the present invention may have any one of the above described magnetoresistance effect elements.

A magnetic recording and/or reproducing system according to another aspect of the present invention may have the above described magnetic head, and can read magnetic information stored in a magnetic recording medium.

The magnetoresistance effect element according to the present invention can effectively utilize the scattering effect depending on spin to have both a high rate of change in MR and an appropriate value of resistance.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DESCRIPTION OF THE EMBODIMENTS

Referring now to the accompanying drawings, the embodiments of the present invention will be described below.

First Embodiment

Figure 1:
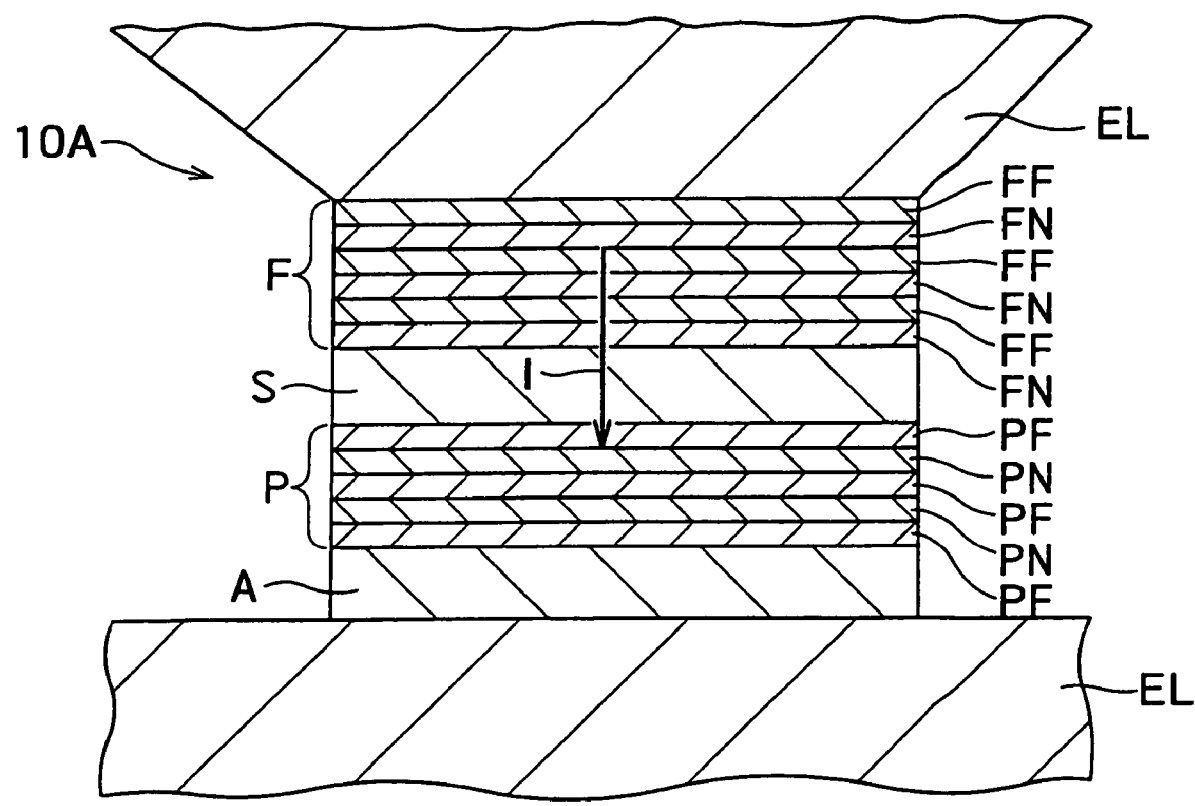
FIG. 1 is a conceptual drawing showing a cross-sectional structure of the first embodiment of a magnetoresistance effect element according to the present invention.

FIG. 1 is a conceptual drawing showing a cross-sectional structure of the first embodiment of a magnetoresistance effect element according to an aspect of the present invention. That is, the magnetoresistance effect element 10A according to the aspect of the present invention comprises an antiferromagnetic layer A, a first magnetic material P, an intermediate non-magnetic layer S and a second magnetic material F which are stacked on a predetermined substrate (not shown) in that order.

Moreover, electrode layers EL are provided on the top and bottom faces of this stacked structure, respectively, and a sense current I is caused to flow in a direction perpendicular to the plane of the film.

In this embodiment, the first magnetic layer P functions as a "pinned layer", the magnetization of which is fixed by one-directional anisotropy due to the antiferromagnetic layer A. In addition, the second magnetic layer F functions as a "magnetic field receiving layer" or "free layer", the magnetization of which is rotated by an external magnetic field (e.g., a signal magnetic field) produced from a magnetic recording medium (not shown).

In this embodiment, the first magnetic layer P and the second magnetic layer F have stacked structures of ferromagnetic layer PF/non-magnetic layer PN and ferromagnetic layer FF/non-magnetic layer FN, respectively. In this stacked layer of ferromagnetic layer/non-magnetic layer, the ferromagnetic layers are ferromagnetically coupled to each other, and magnetization behaves so as to be substantially integrated. That is, the magnetization of each of the ferromagnetic layers included in this stacked structure of ferromagnetic layer/non-magnetic layer is substantially parallel to each other, the magnetization in the pinned layer P being substantially fixed in the same direction, and the magnetizing direction in the free layer F being substantially the same direction corresponding to the external magnetic field.

Figure 23:
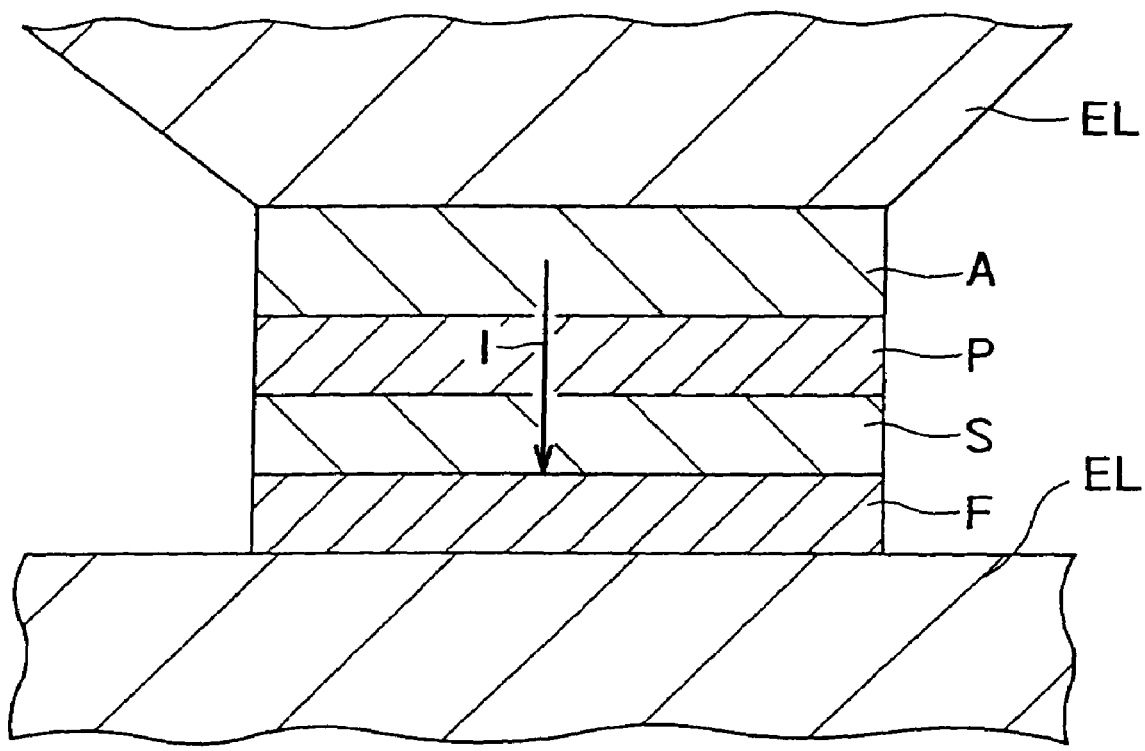
FIG. 23 is a conceptual drawing showing a cross-sectional construction of a CPP-SV element.

In this embodiment, a larger number of interfaces of ferromagnetic layers/non-magnetic layers can be clearly provided in the pinned layer P and free layer F than the CPP spin-valve construction illustrated in FIG. 23. In the CPP spin-valve film, the scattering effect of electron in the interface of ferromagnetic layer/non-magnetic layer, i.e., an interface resistance, has a large spin dependency and has the function of increasing the CPP-MR.

In addition, since the interface resistance has a relatively large value, the value of resistance in a direction perpendicular to the plane of the film can be increased by increasing the number of the interfaces of ferromagnetic layers/non-magnetic layers. According to an aspect of the present invention, it is possible to utilize a larger number of values of interface resistance, and it is possible to provide a CPP-SV having a higher resistance and higher rate of change in MR than those of the CPP spin-valve film illustrated in FIG. 23.

Figure 20:
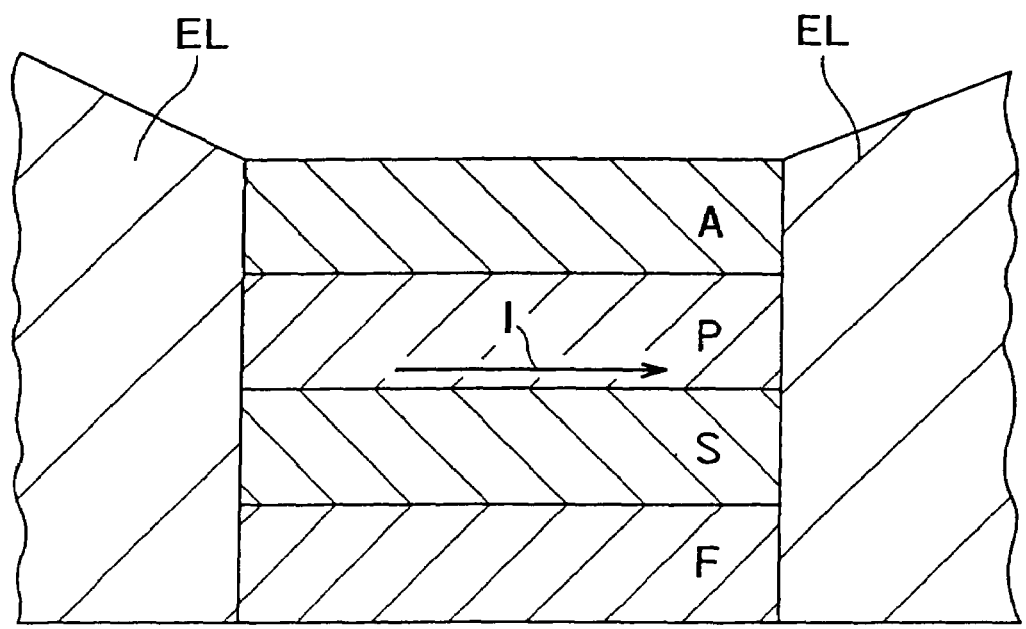
FIG. 20 is a conceptual drawing showing a generally used current supply system.
Figure 21:
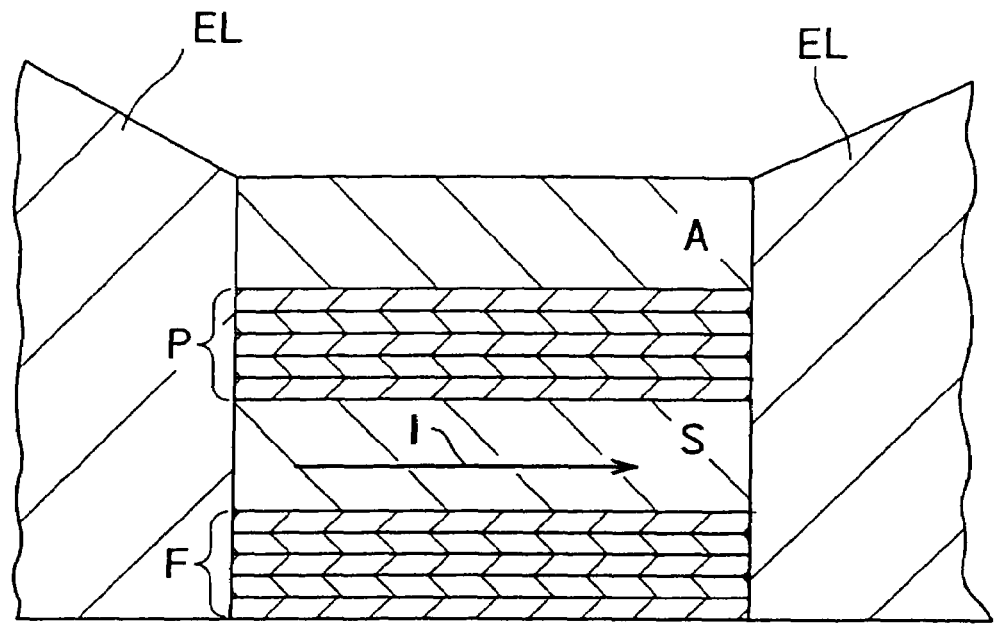
FIG. 21 is a conceptual drawing showing a spin-valve wherein each of a pinned layer and free layer comprises a ferromagnetically coupled magnetic/nonmagnetic layer stacked film.
Figure 22:
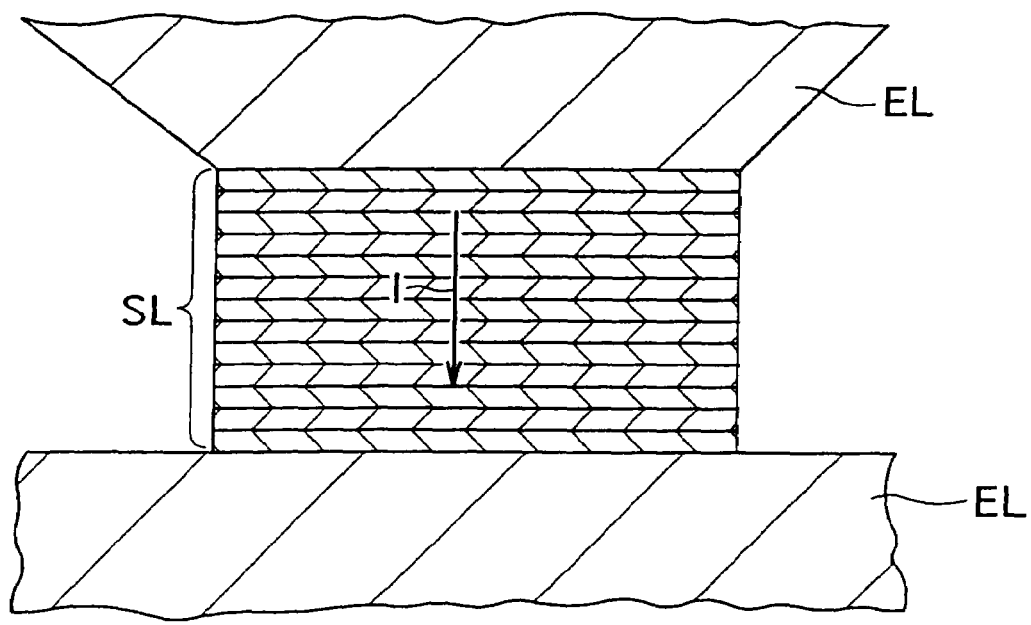
FIG. 22 is a conceptual drawing showing a cross-sectional structure of a CPP-artificial lattice type element.

In addition, since an aspect of the present invention adopts the CPP system wherein a current I flows in a direction perpendicular to the plane of the film, all of current components cross the interfaces of ferromagnetic layers/non-magnetic layers, so that it is possible to very effectively utilize the interface effect which can not effectively be utilized in the case of the CIP system illustrated in FIGS. 20 and 21. For that reason, it is possible to very conspicuously obtain the function of increasing the rate of change in MR which can not sufficiently be obtained by the CIP construction.

Moreover, since a sense current I flows in a direction perpendicular to the plane of the film according to an aspect of the present invention, there is no problem in that the value of resistance is lowered by sandwiching the non-magnetic layer like the CIP system illustrated in FIG. 21.

As described above, according to an aspect of the present invention, it is possible to provide a CPP spin-valve element suitably utilizing an interface resistance and having an appropriate value of resistance though it has a spin-valve construction.

In addition, in this embodiment, since the magnetization of the pinned layer P and the magnetization of the free layer F are operated so as to be integrated, the magnetization can be controlled only by the magnetization fixing of the pinned layer P and the control of the magnetization of one free layer F. As a result, when the element is used for a reading sensor, such as a magnetic head, it is possible to realize a magnetic head wherein Barkhausen noises are suppressed.

In addition, in this embodiment, it is possible to obtain a good value of resistance and a good rate of change in MR while the total thickness of the pinned layer P and free layer F is small. That is, as compared with the simple CPP spin-valve construction illustrated in FIG. 23, it is possible to sufficiently utilize the interface resistance in this construction. Therefore, even if the total Mst of the pinned layer P and free layer F is small, it is possible to obtain a sufficient value of resistance and a sufficient rate of change in MR. Specifically, although the thickness of the magnetic material of the pinned layer P and free layer F must be about 20 nm in the construction of FIG. 23, it is possible to sufficient characteristics in this construction even if the total thickness of the magnetic layer is about 5 nm. Thus, the Mst of the free layer F can be held to be a small value, so that it is possible to form a sensitive spin-valve element. In addition, since it is possible to decrease the Mst of the pinned layer P, it is possible to improve the magnetization fixing characteristics by the anti-ferromagnetic layer, and it is possible to thermally make it stable, so that it is possible to improve the reliability of the device.

In this embodiment, the ferromagnetic layers included in the first and second ferromagnetic layer/non-magnetic layer stacked structure may be formed of, e.g., a simple substance of Co (cobalt), a Co containing ferromagnetic material such as a Co containing magnetic alloy, an Ni base alloy such as NiFe (ferronickel), or an Fe base alloy.

In this embodiment, it is desired to obtain a high interface resistance depending on spin in the interface of ferromagnetic layer/non-magnetic layer. As such a combination of ferromagnetic and non-magnetic layers, the ferromagnetic layer is preferably formed of an Fe base alloy, a Co base alloy or an Ni base alloy, and the non-magnetic layer is preferably formed of Cu (copper), Ag (silver), Au (gold) or an alloy thereof.

In particular, any one of non-ferromagnetic transition metals, such as Rh (rhodium), Ru (ruthenium), Mn (manganese), Cr (chromium), Re (rhenium), Os (osmium) and Ir (iridium), are preferably used. Among these transition metals, Mn or Re is more preferably used.

As a combination in which the interface resistance is particularly high, any one of Fe base alloy/Au, Fe base alloy/Ag, Fe base alloy/Au—Ag alloy, Co base alloy/Cu. Co base alloy/Ag, Co base alloy/Au, and Co base alloy/Cu—Ag-Au alloy is preferably used.

The thickness of the ferromagnetic layers included in the stacked structure of ferromagnetic layer/non-magnetic layer is preferably as thin as possible, in order to increase the number of interfaces without increasing the total Mst. In a combination in which magnetization is held, the magnetic layer may be formed of a monatomic layer. As such a combination, an artificial lattice comprising Fe monatomic layer/Au monatomic layer may be used. Although the upper limit of the thickness is not particularly defined, the thickness is preferably 2 nm or less in order to increase the number of interfaces.

The thickness of the non-magnetic layer included in the stacked structure of ferromagnetic layer/non-magnetic layer is preferably 1 nm or less since the ferromagnetic coupling of ferromagnetic layers to each there must be strong and stable. However, the thickness is preferably selected in accordance with the material of the non-magnetic layer so that the ferromagnetic coupling is stable. Even if the non-magnetic layer is a monoatomic layer as the lower limit, the interface resistance can be produced.

In order to suitably obtain the interface resistance, the combination of materials forming the stacked structure of ferromagnetic layer/non-magnetic layer is preferably a combination wherein the ferromagnetic and non-magnetic layers are non-solid-solution systems. However, the present invention should not always be limited to combinations of non-solid-solution systems.

Figure 2:
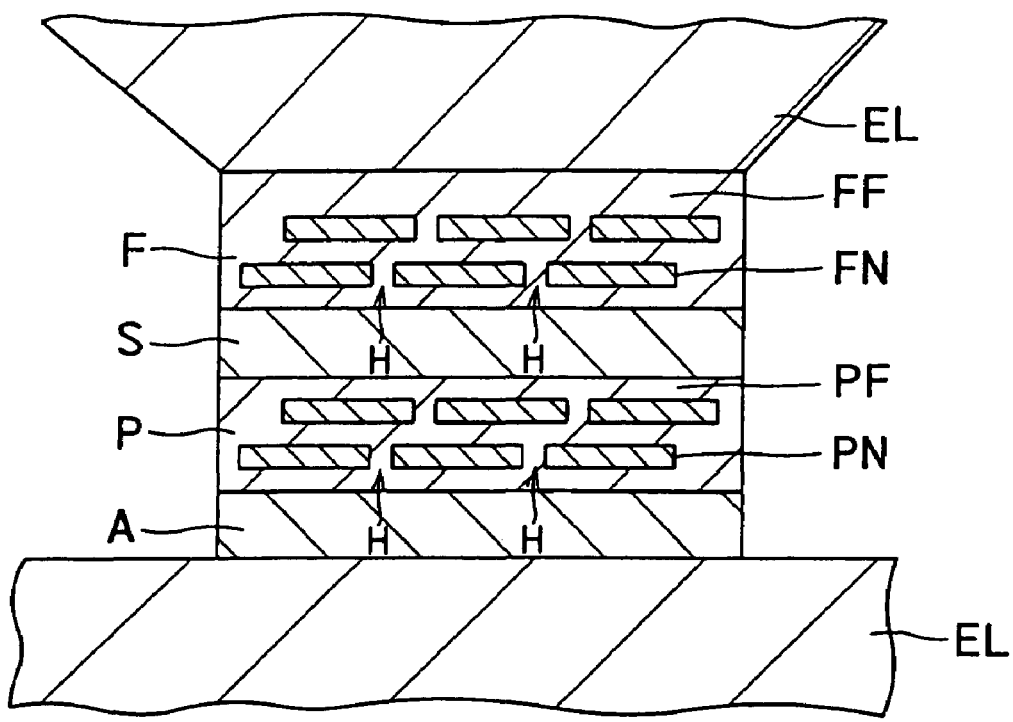
FIG. 2 is a conceptual drawing showing a cross-sectional structure of a magnetoresistance effect element wherein pin holes are formed in non-magnetic layers FN and PN.

The stacked structure of ferromagnetic layer/non-magnetic layer is preferably flat and continuous. However, in order to obtain a good ferromagnetic coupling, there is no problem if the pin holes H are formed in the non-magnetic layers FN and PN as shown in FIG. 2 and if adjacent ferromagnetic layers FF and PF are connected directly to each other in that portion.

Figure 3:
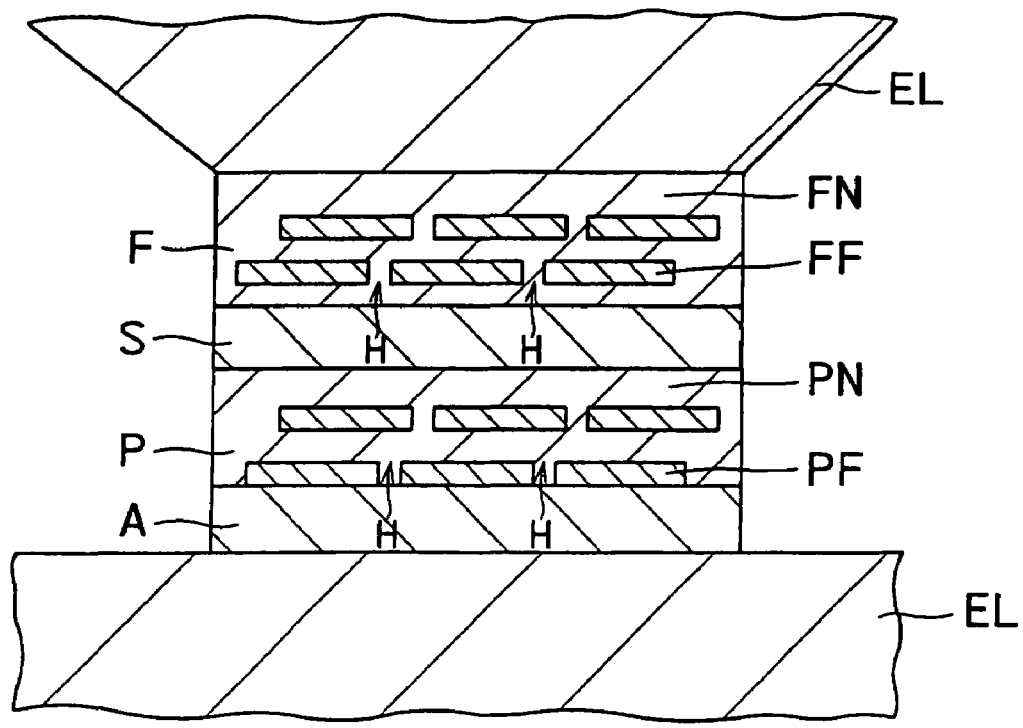
FIG. 3 is a conceptual drawing showing a cross-sectional structure of a magnetoresistance effect element wherein ferromagnetic layers FF and PF are formed in the form of islands.

Conversely, even if the stacked structure is formed so that the ferromagnetic layers FF and PF are arranged in the form of islands as shown in FIG. 3, if the interface of ferromagnetic layer/non-magnetic layer extends substantially in parallel to the plane of the film, there is no problem.

The ferromagnetic layer in the stacked structure of ferromagnetic layer/non-magnetic layer is not always required to be formed of one kind of material.

Figure 4:
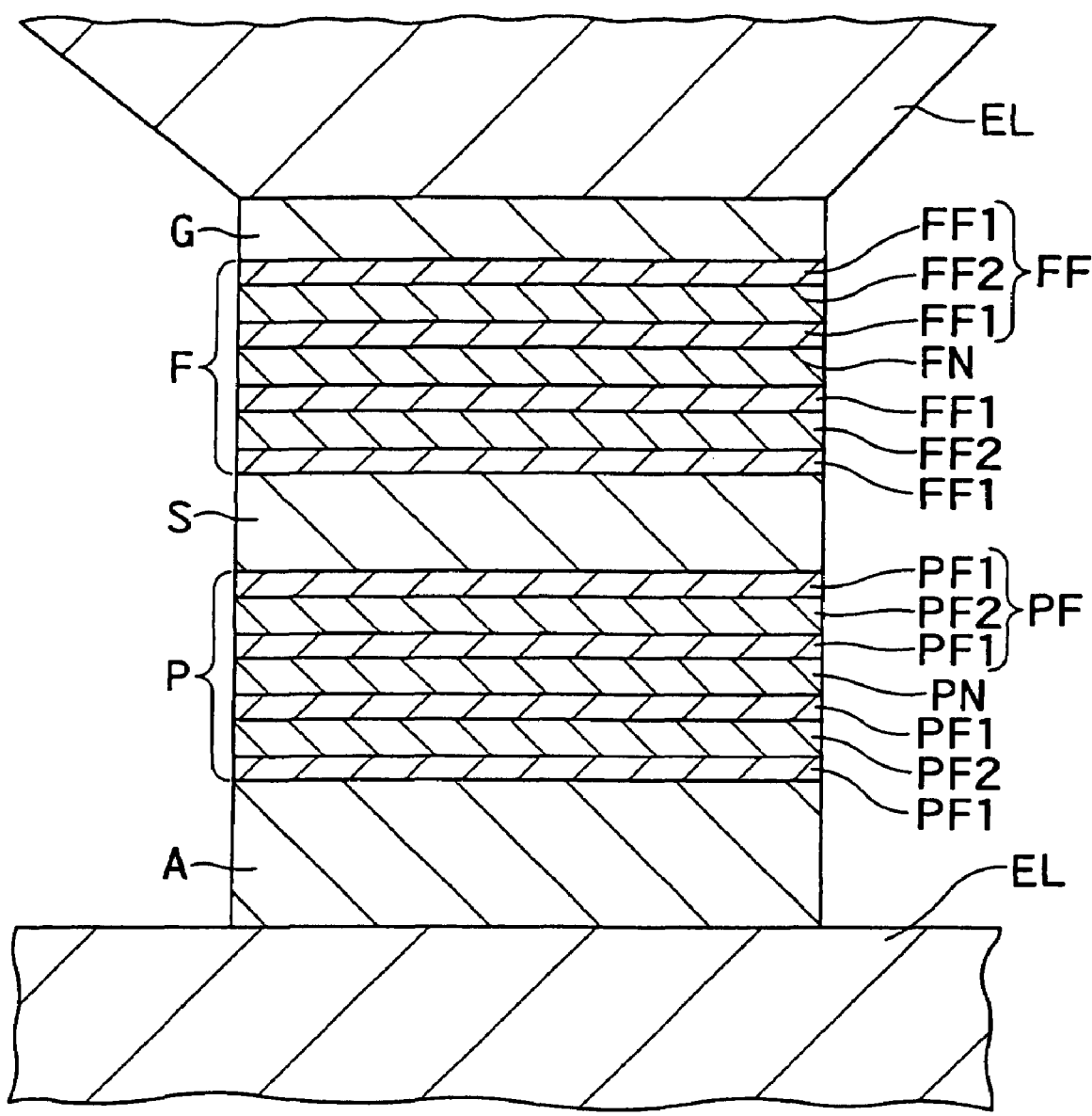
FIG. 4 is a conceptual drawing showing a cross-sectional drawing of a magnetoresistance effect element which uses a stacked film of two kinds of ferromagnetic materials.

In the construction illustrated in FIG. 4, a stacked film of two kinds of ferromagnetic materials. That is, ferromagnetic layers PF constituting a first ferromagnetic layer P constitute a stacked construction of PF1/PF2/PF1, and ferromagnetic layers FF constituting a second ferromagnetic layer F constitute a stacked construction of FF1/FF2/FF1.

More specifically, for example, in the pinned layer P, an Fe/Au interface having a high interface resistance is preferably used. However, since Fe has a large fluctuation in spin, it is desired to inhibit the fluctuation in spin, in order to use it at room temperatures. For that reason, the ferromagnetic layer PF preferably has the stacked structure of Fe and a magnetic material, which has a small fluctuation in spin, such as Fe/CoFe/Fe or Fe/NiFe/Fe.

On the other hand, the Fe/Au interface having a high interface resistance is preferably used for the free layer F. However, it is difficult to obtain magnetically soft characteristics, which are required for the free layer, by only Fe. Therefore, the ferromagnetic layers FF preferably have the stacked structure of Fe and a magnetic material, which has excellent magnetically soft characteristics, such as Fe/CoFe/Fe or Fe/NiFe/Fe.

Furthermore, in FIG. 4, a high conductive layer G of Cu, Ag, Au or the like is stacked on the free layer F.

Figure 5:
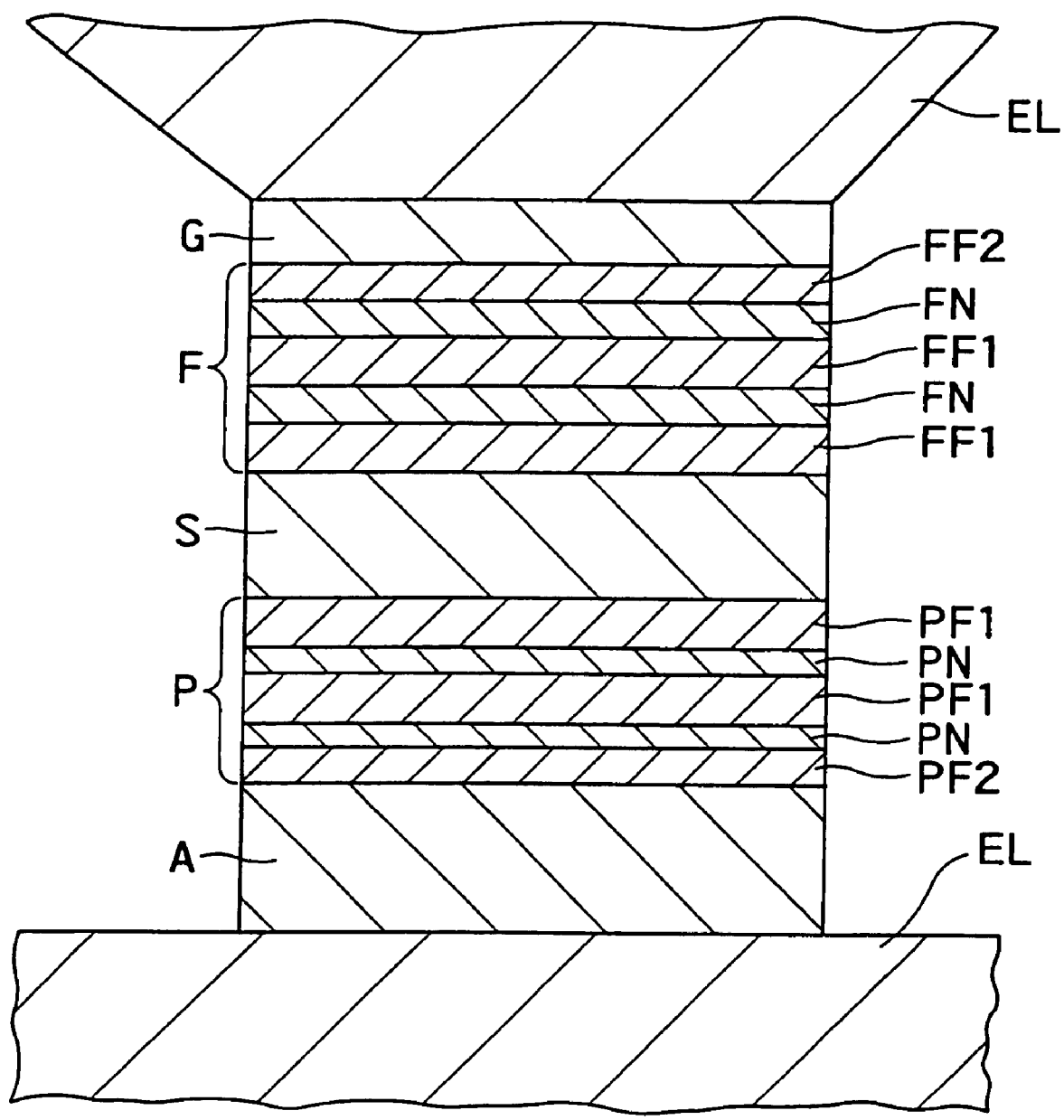
FIG. 5 is a conceptual drawing showing a cross-sectional structure of a magnetoresistance effect element which is formed of two kinds or more of ferromagnetic materials.

On the other hand, the ferromagnetic layer in the stacked structure of ferromagnetic layer/non-magnetic layer is not always required to be formed of one kind of material. As shown in FIG. 5, the ferromagnetic layer may be two or more kinds of ferromagnetic materials. For example, although an Fe/Au interface having a high interface resistance is preferably used in the free layer F which is provided between the high conductive layer G and the non-magnetic intermediate layer S, it is difficult to obtain magnetically soft characteristics, which are required for the free layer, by only the ferromagnetic layer FF1 of Fe. For that reason, it is possible to improve magnetically soft characteristics by adding the ferromagnetic layer FF2 of a magnetic material having excellent magnetically soft characteristics, such as CoFe or NiFe, which is ferromagnetically coupled as a ferromagnetic layer.

In addition, when the ferromagnetic layer in the stacked structure of ferromagnetic layer/non-magnetic layer contains Fe or an Fe base alloy, it preferably has the face-centered cubic (fcc) structure. Because the stacked structure can be more stable when an fcc metal, such as Au, Ag or Cu, which constitutes the non-magnetic layer, is stacked and because the stacked structure can have good crystalline properties as a whole to improve magnetically soft characteristics and reduce fluctuation in spin. However, the body-centered cubic (bcc) structure can also be used.

When two or more kinds of ferromagnetic layers are combined as illustrated in FIGS. 4 and 5, a ferromagnetic material having the fcc structure can be combined with a ferromagnetic material having the bcc structure. In such a combination, the state of electrons, the shape of the Fermi surface, and the distribution of state density of the fcc ferromagnetic material are greatly different from those of the bcc ferromagnetic material. For that reason, it is possible to obtain a considerable screen effect with respect to conduction electrons, so that it is possible to obtain a high resistance and a high rate of change in MR.

Figure 6:
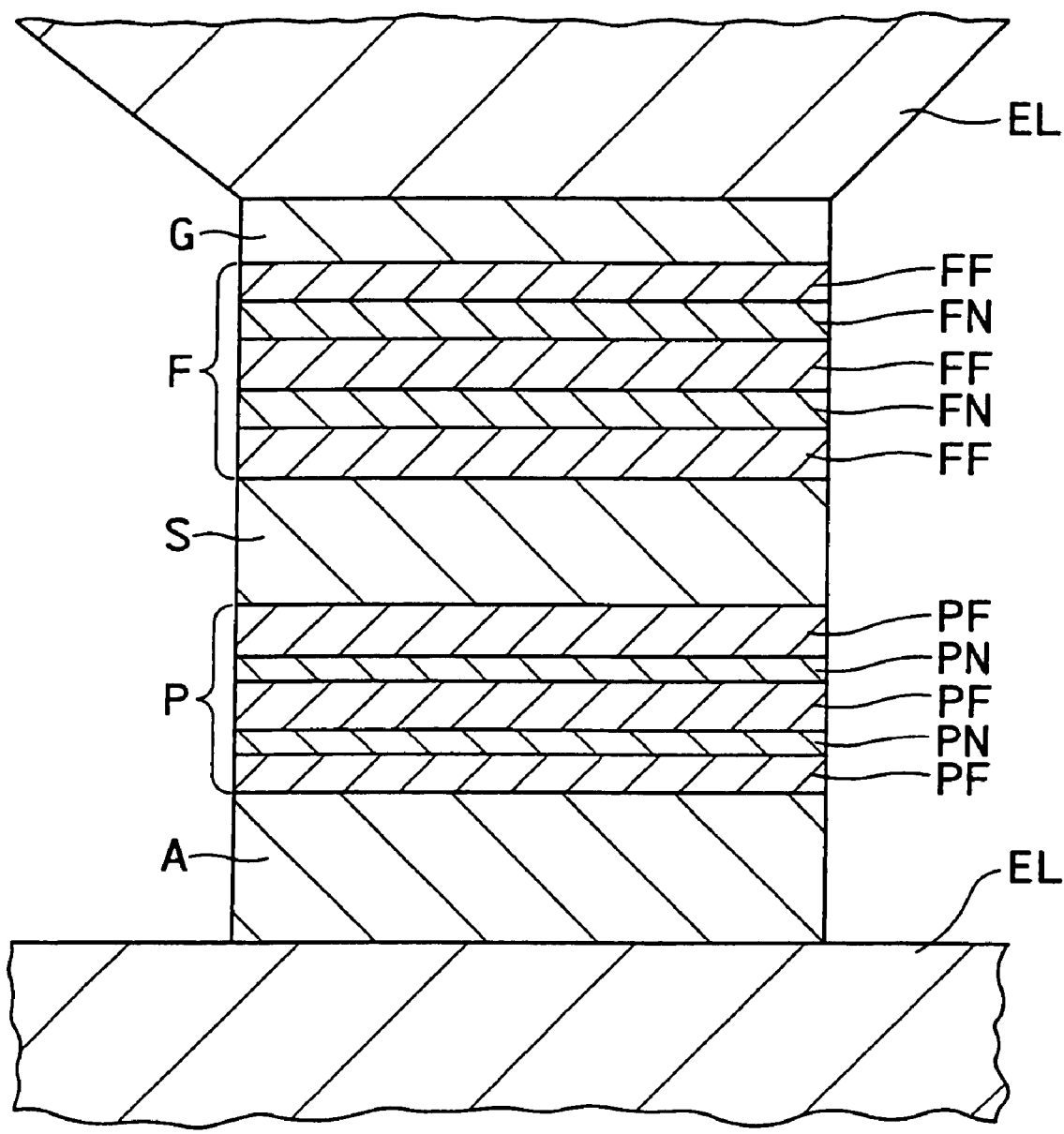
FIG. 6 is a conceptual drawing showing a cross-sectional structure of a magnetoresistance effect element wherein a bcc ferromagnetic material and an fcc ferromagnetic material are combined.

FIG. 6 is a conceptual drawing showing an example of a combination of a bcc ferromagnetic material with an fcc ferromagnetic material. That is, in a spin-valve shown in this figure, a first magnetic layer P has the stacked structure of ferromagnetic layers PF having the bcc structure and non-magnetic layers PN, and a second magnetic layer F has the stacked structure of ferromagnetic layers FF having the fcc structure and non-magnetic layers FN. Thus, even if the ferromagnetic layers of the pinned layer P and free layer F have different crystal structures, it is possible to obtain a large screen effect.

In each of the above described magnetic layers, the Fe base alloy is preferably a material, which can easily obtain magnetically soft characteristics, such as Fe, FeNi, FeCo, FeSi, FeMo or FeAl.

The Co containing alloy is an alloy of Co, to which one or more of Fe, Ni, Au, Ag, Cu, Pd, Pt, Ir, Rh, Ru, Os and Hf are added. The amount of the additional element is preferably in the range of from 5 to 50 at %, and more preferably in the range of from 8 to 20 at %. Because there is the possibility that the bulk effect does not sufficiently increase if the amount of the additional element is too small and that the interface effect greatly decreases if the amount of the additional element is too large. In order to obtain a high rate of change in MR, the additional element is preferably Fe.

By the way, in the CPP-SV, the scattering of electrons occurs when conductive electrons pass through the pinned layer P and the free layer F, respectively. If the pinned layer P or the free layer F is multilayered according to an aspect of the present invention, the modulation of band potential based on the staked period of the multilayered structure is carried out. Therefore, if the stacking period in the pinned layer is different from that in the free layer, the "screen effect" of electrons can be obtained.

Figure 7:
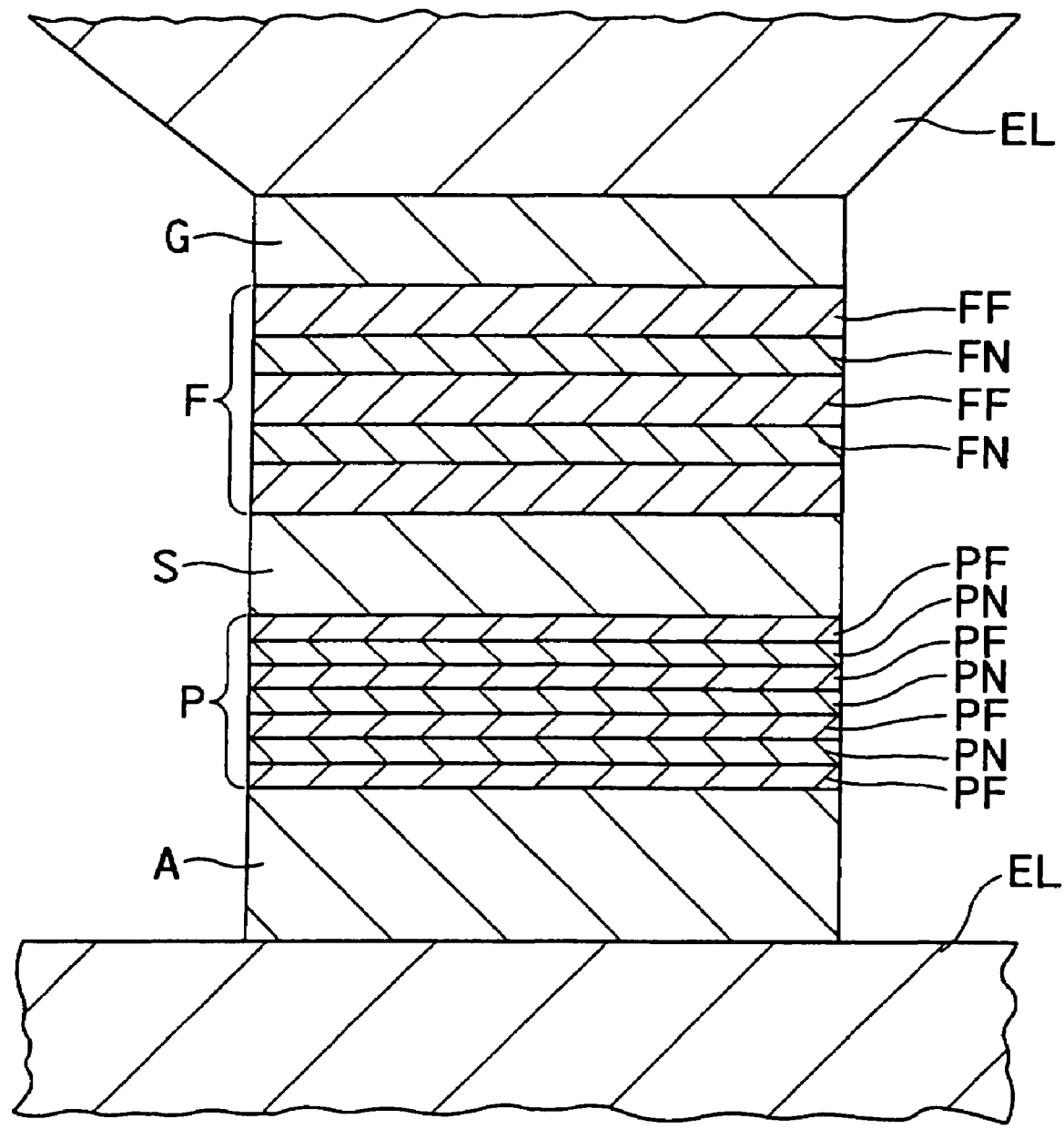
FIG. 7 is a conceptual drawing showing an example of a spin-valve element wherein the stacking period in a pinned layer is different from the stacking period of a free layer.

FIG. 7 is a conceptual drawing showing an example of a spin-valve element wherein the stacking period in a pinned layer is different from the stacking period in a free layer.

Figure 8A:
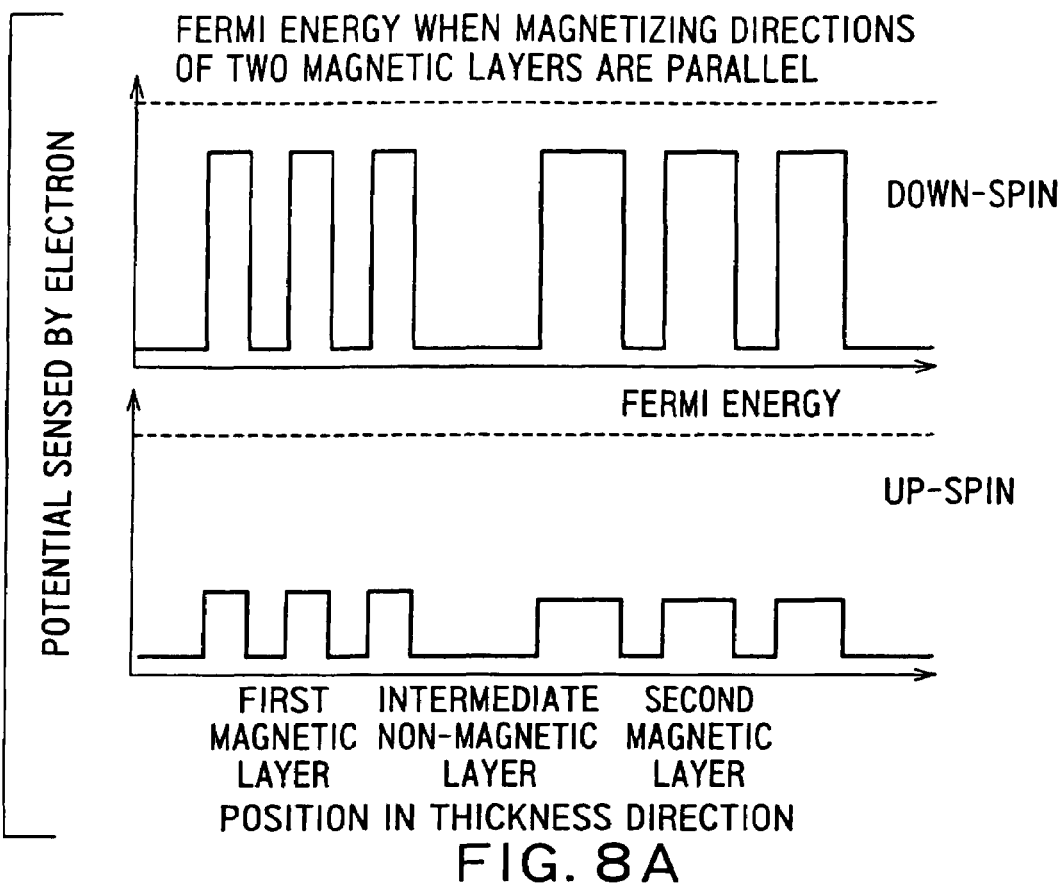
FIG. 8A is a conceptual drawing showing modulation of potential in the spin-valve element of FIG. 7 when the magnetization of the pinned layer is parallel to the magnetization of the free layer.
Figure 8B:
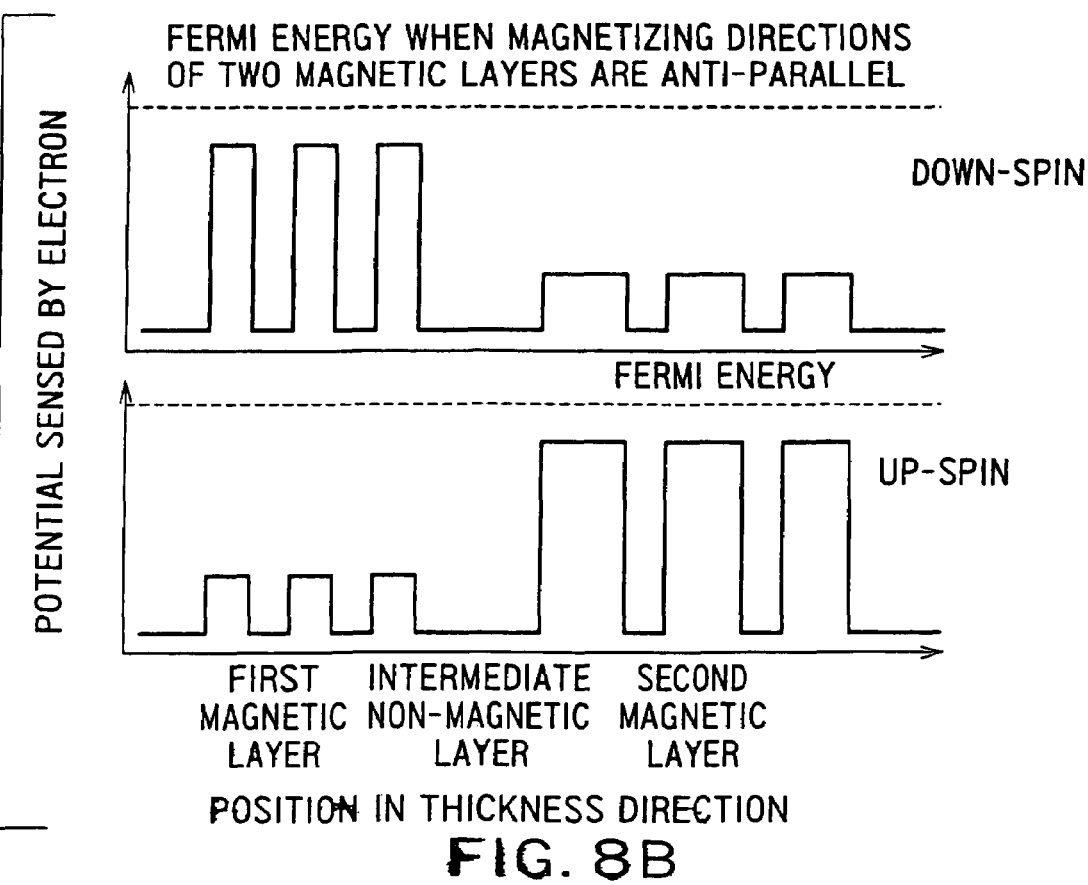
FIG. 8B is a conceptual drawing showing modulation of potential in the spin-valve element of FIG. 7 when the magnetization of the pinned layer is anti-parallel to the magnetization of the free layer.

FIGS. 8A and 8B are conceptual drawings showing modulation of potential in this spin-valve element. That is, FIG. 8A is a graph showing potentials sensed by electrons in the cases of up-spin and down-spin when the magnetization of the pinned layer is parallel to the magnetization of the free layer, and FIG. 8B is a graph showing potentials sensed by electrons in the cases of up-spin and down-spin when the magnetization of the pinned layer is anti-parallel to the magnetization of the free layer.

In the example shown in FIG. 7, the stacking period of ferromagnetic layer/non-magnetic layer in the first magnetic layer (pinned layer) P is shorter than the stacking period of ferromagnetic layer/non-magnetic layer in the second magnetic layer (free layer) F.

The wave number vector of electrons flowing in a direction perpendicular to the plane of the film is perturbed in accordance with modulation of band potential. The perturbed wave number varies in accordance with the period of the multilayered structure. Therefore, the stacking periods in the pinned layer P and free layer F are changed as illustrated in FIG. 7, it is possible to greatly restrict the wave number of electrons capable of passing through both layers. Moreover, since the screen effect itself has the spin dependence effect, it is possible to hold a high spin dependency while maintaining a low transmission probability of electrons as a whole. For that reason, if the stacking periods in the pinned layer P and free layer F are intentionally changed, it is possible to form a CPP-SV capable of realizing a high rate of change in MR while maintaining a higher resistance.

In FIGS. 8A and 8B, the axis of ordinates of each graph shows potentials sensed by conductive electrons, and the axis of abscissas shows the position of the spin-valve element in thickness directions. The potential sensed by conductive electrons corresponds to Fermi energy when the conductive electrons in a metal are approximated by a free electron model. As the Fermi wave number on the Fermi surface increases, the Fermi energy increases, and the potential is more deeply sensed. The depth of the potential varies in accordance with the kind of the metal, the potential is modulated in thickness directions if the stacked structure is formed.

In FIGS. 8A and 8B, the shallow potential portion shows a state that the number of conductive electrons is small and the Fermi energy is low. On the other hand, the deep potential portion shows a state that the number of conductive electrons is large and the Fermi energy is high. Since conductive electrons are spin-divided by exchange energy in the magnetic material, the magnitude of potential sensed by conductive electrons in the case of down-spin is different from that in the case of up-spin.

Due to the above described effects, the potentials sensed by conductive electrons in the CPP-SV film according to the present invention have structures shown in FIGS. 8A and 8B. That is, since the first and second magnetic layers have the stacked structure of magnetic layer/non-magnetic layers, the potential sensed by conductive electrons is Clonich-Penny-modulated, and a mini gap is formed in the band structure of conductive electrons. Since how to form the mini gap is influenced by the stacking period, the place of the mini gap to be formed varies if the stacking period in the first magnetic layer is different from the stacking period in the second magnetic layer.

For that reason, if electrons are caused to flow in such a CPP-SV in a direction perpendicular to the plane of the film, there is a strong probability that the conduction of electrons is inhibited by the gap, so that it is possible to restrict the transmission probability of conductive electrons as a whole.

In addition, since the depth of the potential sensed by conductive electrons in the case of up-spin is different from that in the case of down-spin, how to restrict the transmission probability of conductive electrons depends on spin, so that it is possible to produce a large scattering effect depending on spin.

From the above described effects, it is possible to form a CPP-SV having a high resistance and a high rate of change in resistance.

On the other hand, according to an aspect of the present invention, the ferromagnetic layers must be ferromagnetically coupled to each other in the stacked structure of ferromagnetic layer/non-magnetic layer constituting the pinned layer P and free layer F. For that purpose, it is required to form a good stacked structure. In addition, the magnetic characteristics of the pinned layer P and free layer F can be improved by adjusting the crystal lattice constant in the stacked structure to be the optimum value.

Figure 9:
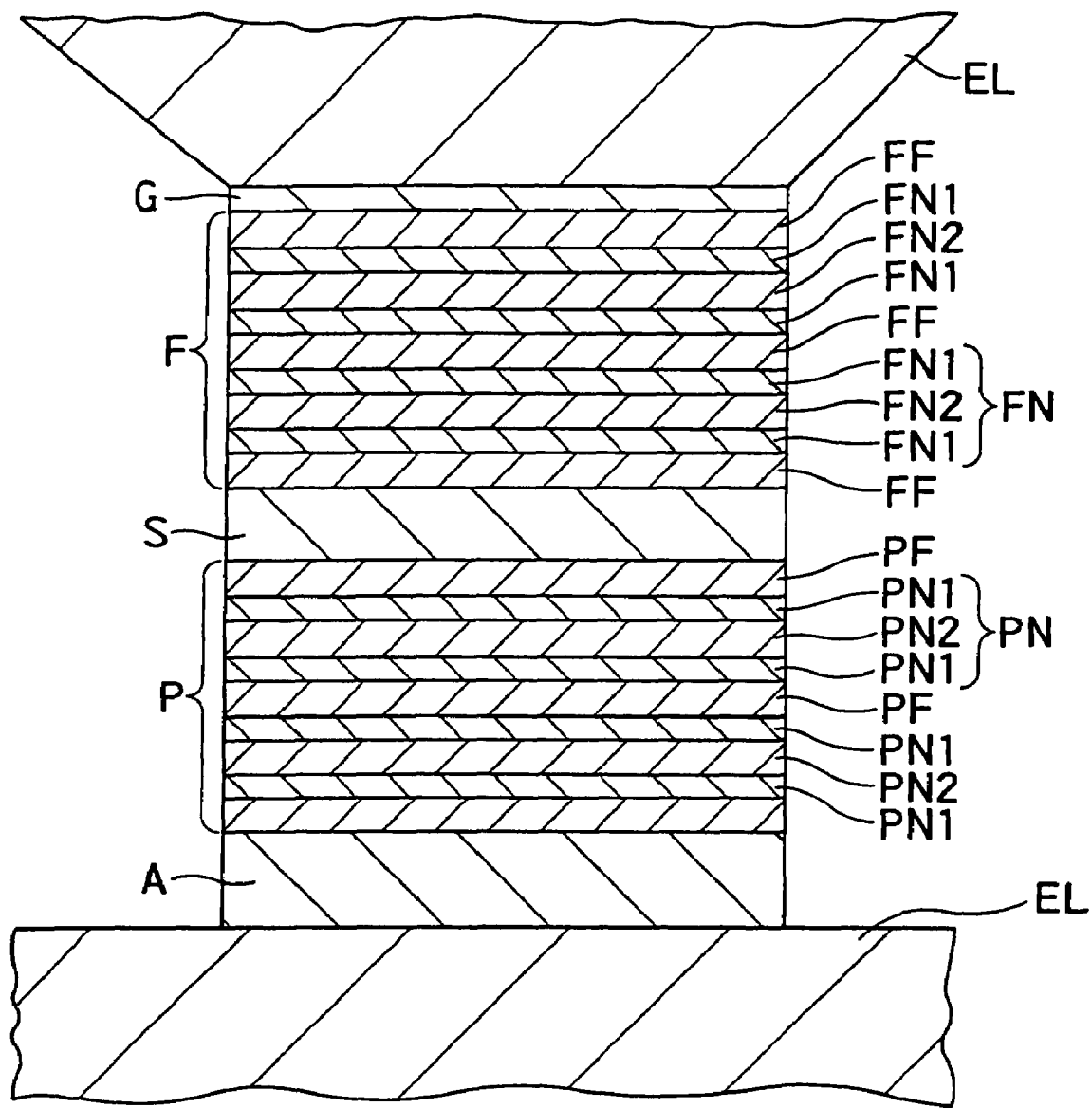
FIG. 9 is a conceptual drawing showing a cross-sectional structure of a magnetoresistance effect element wherein a non-magnetic layer has a stacked structure.

Therefore, the non-magnetic layer can also have a stacked structure, such as Au/Cu/Au, as shown in FIG. 9, so that it is possible to realize a good lattice constant while realizing a high interface resistance and it is possible to obtain good magnetic characteristics. That is, in the example shown in FIG. 9, in the ferromagnetic layer PF/non-magnetic layer PN constituting the first magnetic layer (pinned layer) P, the non-magnetic layer PN has such a construction that the second non-magnetic layer PN2 is sandwiched between the first non-magnetic layers PN1. Similarly in the second magnetic layer (free layer) F, the non-magnetic layer FN has a sandwich structure that the second non-magnetic layer FN2 is sandwiched between the first non-magnetic layers FN1.

In the construction of FIG. 9, the material of the non-magnetic intermediate layer S is preferably a material, in which the mean free path of conductive electrons is long, such as Cu, Au or Ag. By using such a material, electrons can varistically conduct from the ferromagnetic layer forming an electrode to the ferromagnetic layer F, so that it is possible to more effectively utilize the scattering effect of electrons depending on spin which is caused by the ferromagnetic material. Thus, it is possible to obtain a higher rate of change in MR. Alternatively, the non-magnetic intermediate layer S may be formed of an alloy of the above described three elements. In that case, the composition is preferably adjusted so that the crystal lattice constant in the stacked structure can be adjusted to be the optimum value.

On the other hand, the non-magnetic intermediate layer S may be multilayered.

Figure 10:
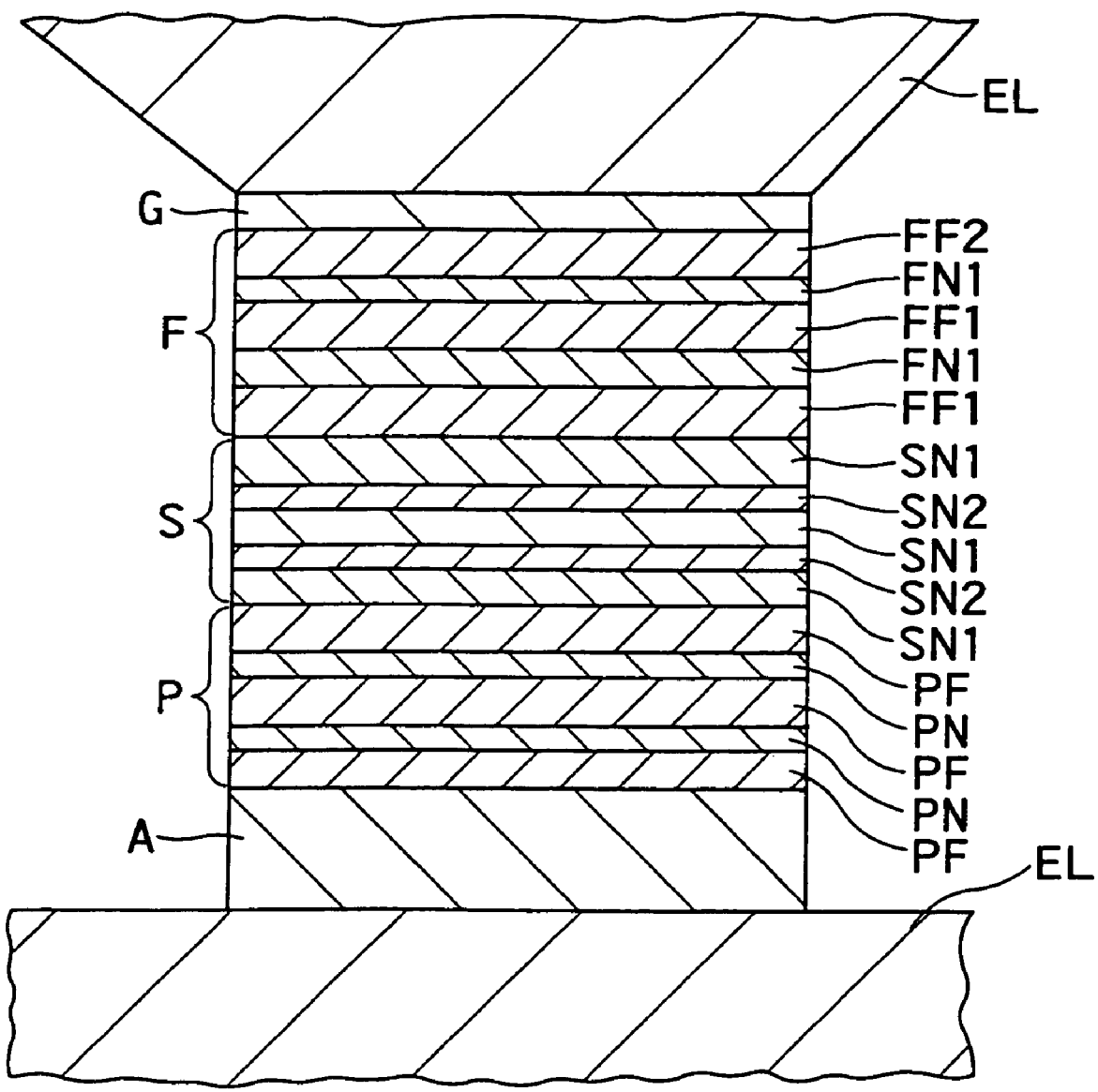
FIG. 10 is a conceptual drawing showing a spin-valve element wherein a non-magnetic intermediate layer S comprises multiple layers.

FIG. 10 is a conceptual drawing showing a spin-valve element wherein a non-magnetic intermediate layer S is multilayered. That is, in the spin-valve element shown in this figure, the non-magnetic intermediate layer S has the stacked structure of first non-magnetic layers SN1 and second non-magnetic layers SN2. All of the non-magnetic layers may be formed of a material, such as Cu, Au or Ag. In this case, conductive electrons can also be perturbed by the stacking period of the stacked structure of non-magnetic layer/non-magnetic layer. That is, if the stacking period of non-magnetic layer/non-magnetic layer of the non-magnetic intermediate layer S, and the stacking period of the pinned layer p or the free layer F are suitably set, the wave number vector of electrons capable of flowing through the whole CPP-SV in a direction perpendicular to the plane of the film can be further restricted, so that it is possible to form a CPP-SV capable of realizing a higher resistance and a higher rate of change in MR.

On the other hand, the material of the antiferromagnetic layer A is preferably a metallic antiferromagnetic material having excellent magnetization fixing characteristics. Specifically, an antiferromagnetic material, such as PtMn, NiMn, FeMn or IrMn, may be used. The thickness of the antiferromagnetic layer A is preferably as thin as possible from the standpoint of electric characteristics. However, if the antiferromagnetic layer A is too thin, the magnetization fixing characteristics deteriorate, so that it is required to select such a thickness that the blocking temperature does not decrease. For that reason, the thickness is preferably 5 nm or more.

On the other hand, in addition to the above described construction, a magnetic layer antiferromagnetically coupled to another ferromagnetic layer may be added any one or both of the first magnetic layer P and the second magnetic layer F to form a so-called "synthetic antiferromagnetic layer structure".

Figure 11:
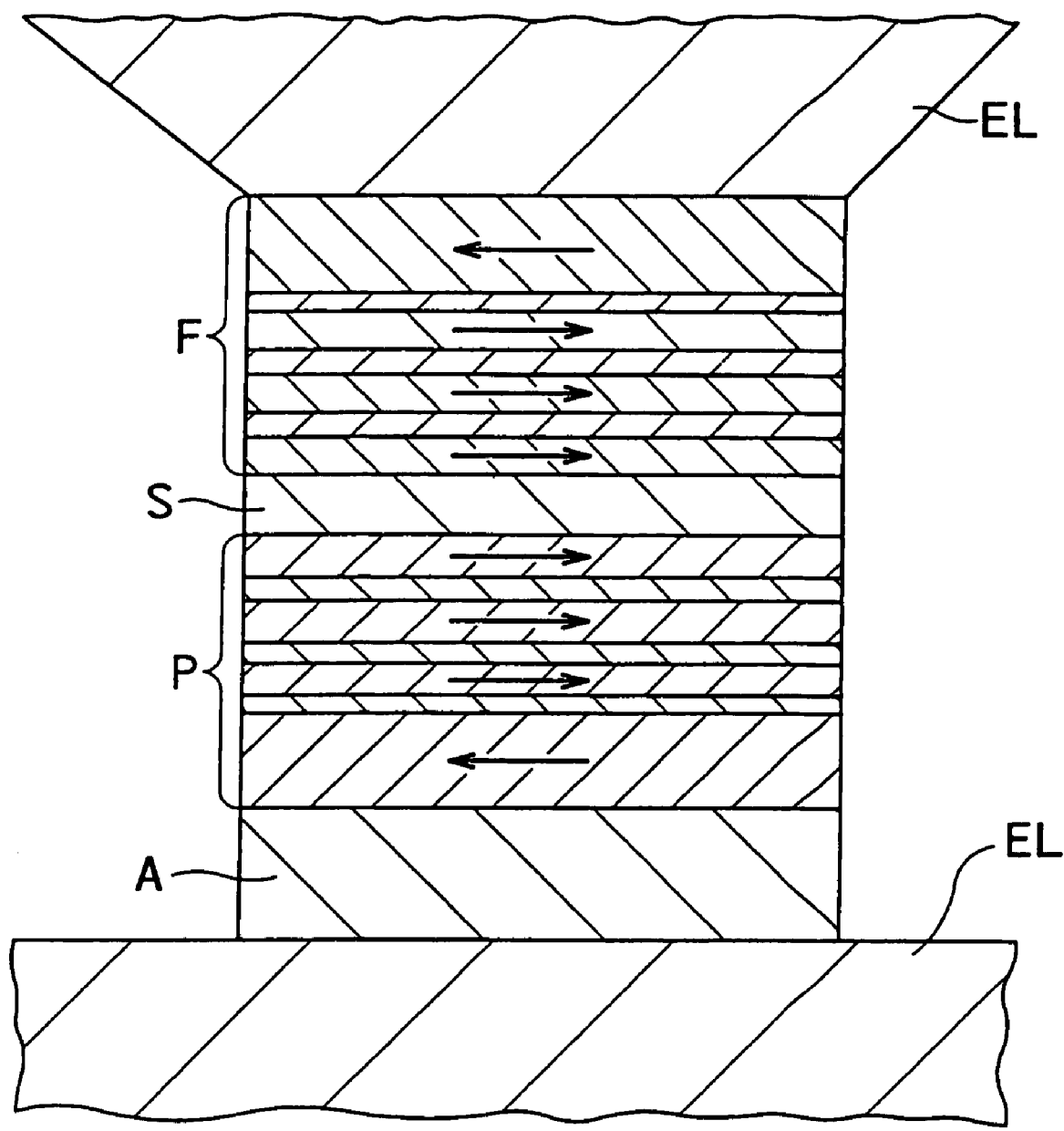
FIG. 11 is a conceptual drawing showing a cross-sectional construction of a spin-valve element having a synthetic structure.

FIG. 11 is a conceptual drawing showing a cross-sectional construction of a spin-valve element having a synthetic structure. That is, in the example shown in this figure, each of the pinned layer P and the free layer F has the synthetic structure of magnetic layers magnetized in directions shown by arrows in the figure. By forming such synthetic structures, the apparent magnetization can be zero in the pinned layer P, so that the magnetization fixing in the pinned layer can be more stable. In addition, by decreasing the apparent magnetization in the free layer F, it is possible to obtain a more sensitive response to external magnetic field.

On the other hand, while no special layer has been provided between the electrode EL and the spin-valve in the above described construction, other layers may be provided when an actual element is formed.

Figure 12:
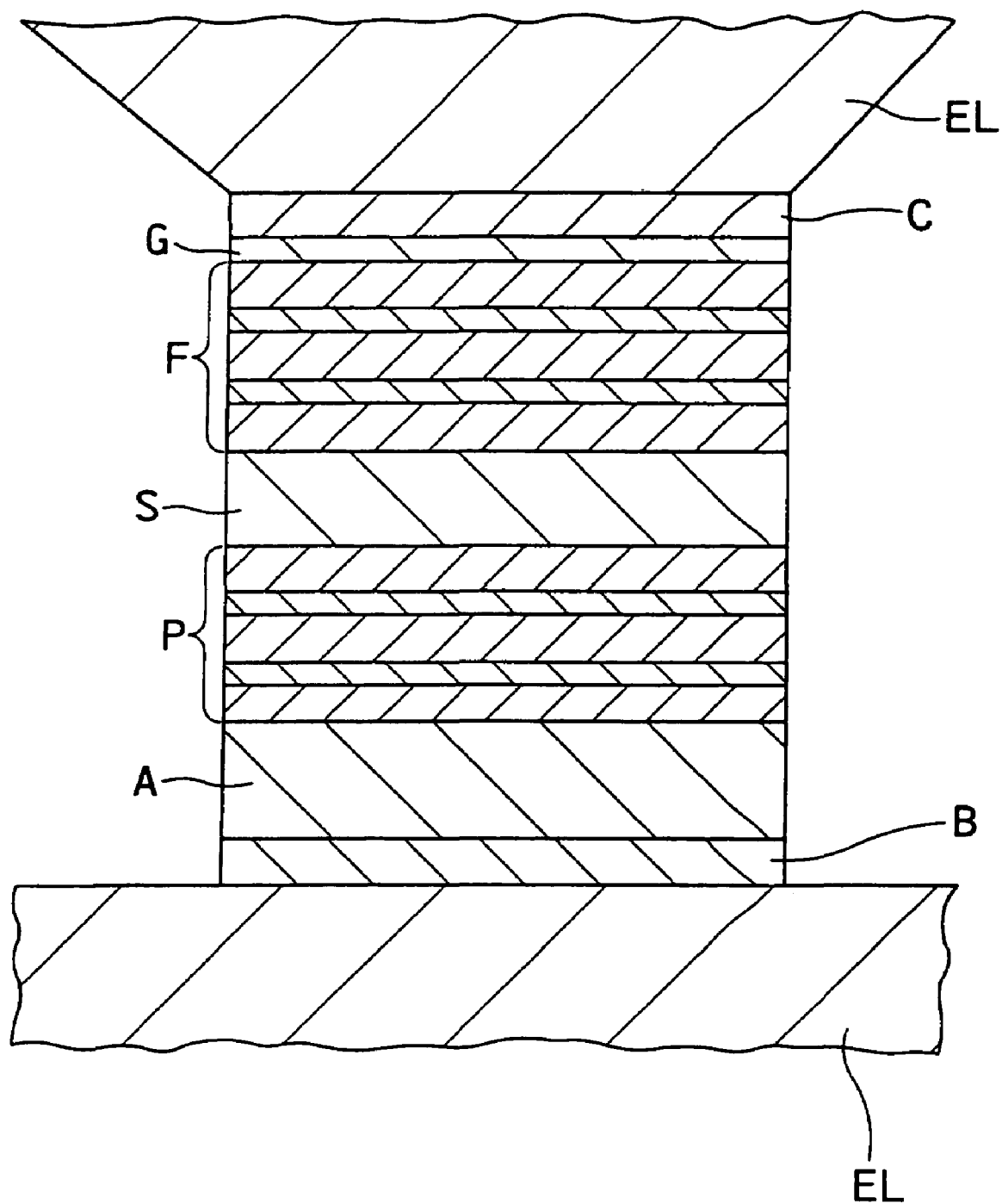
FIG. 12 is a conceptual drawing showing a cross-sectional structure of a magnetoresistance effect element having a buffer layer and a protective layer.

In the spin-valve element illustrated in FIG. 12, a buffer layer (underlying layer) B is provided between an electrode EL and an antiferromagnetic layer A for improving smoothness and crystalline properties. In addition, a protective layer C is provided between the top electrode EL and the free layer F.

The buffer layer (underlying layer) B and the protective layer C are preferably formed of a material having a good wetting property, such as Ta, Ti or Cr, a material having a low electric resistance and a stable fcc structure, such as Cu, Au or Ag, or a stacked structure thereof.

As the first embodiment of the present invention, the spin-valve element of the CPP type wherein at least one of the pinned layer and the free layer has the stacked structure of ferromagnetic layers and non-magnetic layers has been described above.

Second Embodiment

The second embodiment of the present invention will be described below.

Figure 13:
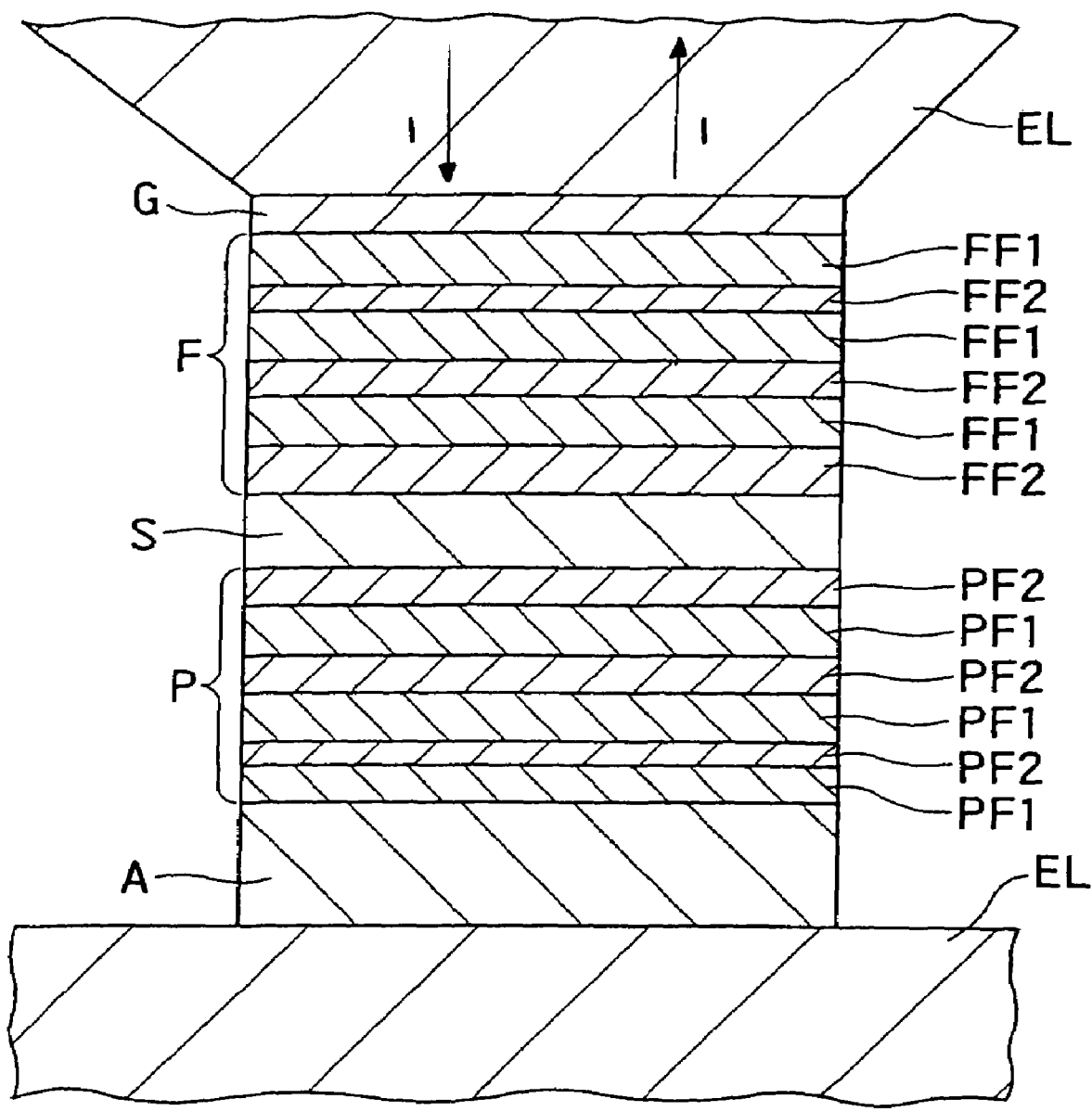
FIG. 13 is a conceptual drawing showing a cross-sectional structure of the second embodiment of a magnetoresistance effect element according to the present invention.

FIG. 13 is a conceptual drawing showing a cross-sectional structure of a magnetoresistance effect element according to the second embodiment of the present invention. That is, the magnetoresistance effect element according to the second embodiment comprises an antiferromagnetic layer A, a first magnetic material P, a non-magnetic intermediate layer S, a second magnetic material F and a high conductive layer G, which are stacked on a predetermined substrate (not shown) in that order.

Moreover, electrode layers EL are provided on the top and bottom faces of this stacked structure, respectively, and a sense current I is supplied in a direction perpendicular to the plane of the film.

Also in this embodiment, the first magnetic layer P functions as a "pinned layer", the magnetization of which is fixed by one-directional anisotropy due to the antiferromagnetic layer A. In addition, the second magnetic layer F functions as a "magnetic field receiving layer" or "free layer", the magnetization of which is rotated by an external magnetic field (e.g., a signal magnetic field) produced from a magnetic recording medium (not shown).

In this embodiment, the first magnetic layer P or the second magnetic layer F has the stacked structure of ferromagnetic layers and non-magnetic layers. That is, in the embodiment shown in FIG. 13, the pinned layer P has the stacked structure of first ferromagnetic layers PF1 and second ferromagnetic layers PF2, and the free layer F has the stacked structure of first ferromagnetic layers FF1 and second ferromagnetic layers FF2.

In the stacked layer of ferromagnetic layer/ferromagnetic layer in this embodiment, the ferromagnetic layers are ferromagnetically coupled to each other, and magnetization behaves so as to be substantially integrated. That is, the magnetization of each of the ferromagnetic layers included in this stacked structure of ferromagnetic layer/ferromagnetic layer is substantially parallel to each other, the magnetization in the pinned layer P being substantially arranged in the same direction, and the magnetizing direction in the free layer F being substantially the same direction with respect to the external magnetic field.

After the inventor had studied the effects of the interface resistance, the inventor found that the effect of the scattering of electrons on the interface of ferromagnetic layer/ferromagnetic layer, i.e. the interface resistance, in the CPP-SV, has a large spin dependency to serve to increase the CPP-MR.

In this embodiment, it is possible to provide many interfaces of ferromagnetic layer/ferromagnetic layer in the pinned layer P and free layer F, to utilize a larger number of values of interface resistance, so that it is possible to form a CPP-SV having a high resistance and a high rate of change in MR.

Since the magnetization of the pinned layer P and the magnetization of the free layer F are operated so as to be integrated, the magnetization can be controlled only by the magnetization fixing of the pinned layer and the control of the magnetization of one free layer. As a result, when the element is used for a reading sensor, such as a head, it is possible to form a head of Barkhausen noise free.

The first and second ferromagnetic layers are formed of, e.g., a simple substance of Co, a Co containing ferromagnetic material such as a Co containing magnetic alloy, a ferromagnetic material such as NiFe alloy, or an Fe base alloy.

As a combination in which the interface resistance is particularly high, any one of NiFe alloy/CoFe alloy, Fe base alloy/NiFe alloy, and Fe base alloy/CoFe alloy is preferably used.

The thickness of the ferromagnetic layers included in the stacked structure of ferromagnetic layer/ferromagnetic layer is preferably as thin as possible, in order to increase the number of interfaces without increasing the total Mst. In a combination in which magnetization is held, the magnetic layer may be formed of a monatomic layer. Although the upper limit of the thickness is not particularly defined, the thickness is preferably 2 nm or less in order to increase the number of interfaces.

The thickness of the magnetic layer included in the stacked structure of ferromagnetic layer/ferromagnetic layer is preferably 1 nm or less in order to increase the number of interfaces. Even if the magnetic layer is a monoatomic layer as the lower limit, the interface resistance can be produced.

In order to suitably obtain the interface resistance, the combination of materials forming the stacked structure of ferromagnetic layer/ferromagnetic layer is preferably a combination wherein adjacent ferromagnetic layers are non-solid-solution systems. However, the present invention should not always be limited to combinations of non-solid-solution systems.

The ferromagnetic layers of the pinned layer P and free layer F in this embodiment are not always required to be formed of two kinds of materials, but the ferromagnetic layers may be formed of three kinds or more of ferromagnetic materials.

Figure 14:
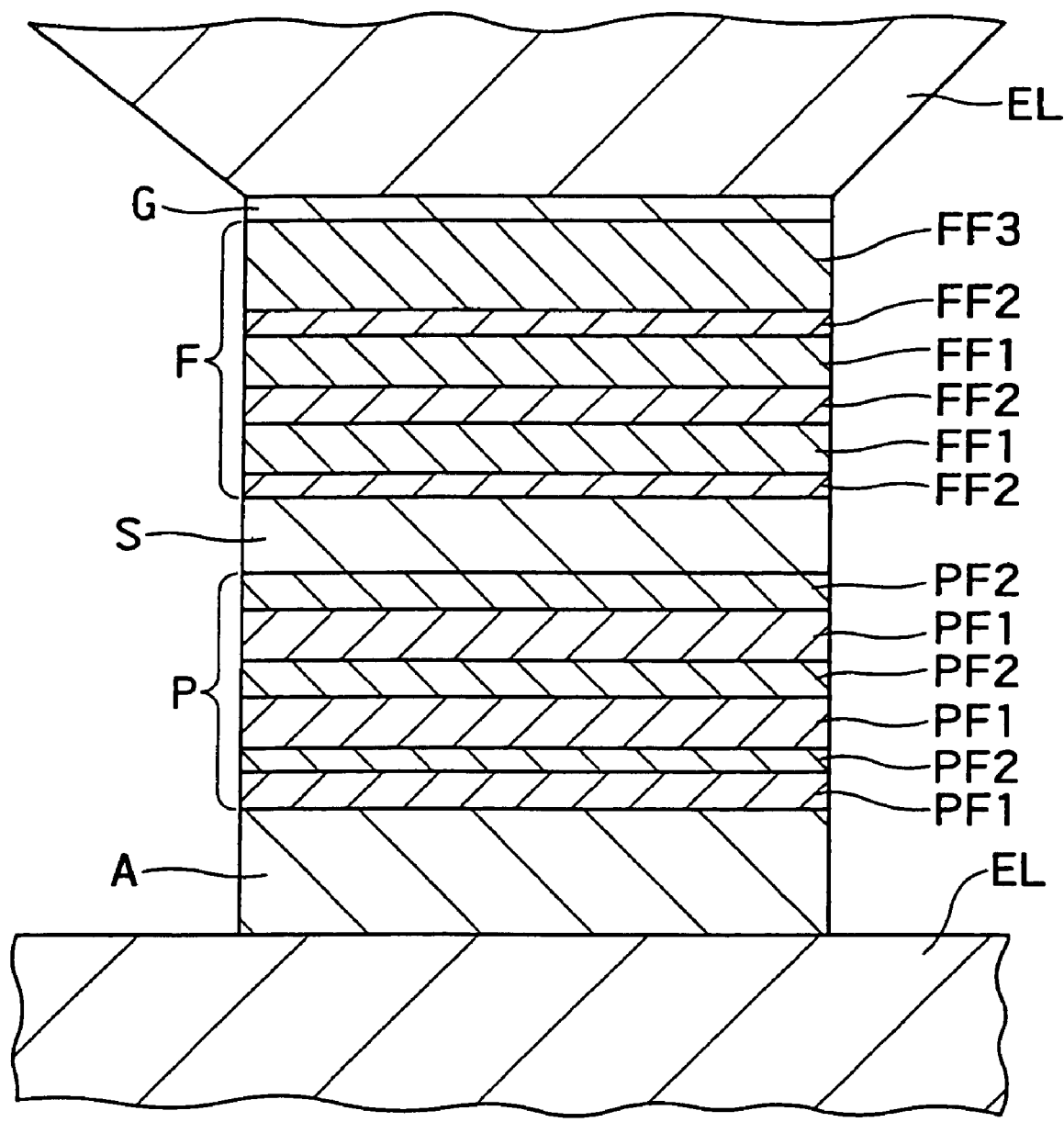
FIG. 14 is a conceptual drawing showing an example of a case where a free layer has three kinds of ferromagnetic layers.

FIG. 14 is a conceptual drawing showing an example where a free layer has three kinds of ferromagnetic layers. That is, in a spin-valve element shown in this figure, a free layer F has the stacked structure of a first ferromagnetic layer FF1, a second ferromagnetic layer FF2 and a third ferromagnetic layer FF3.

In the free layer F, the Fe/CoFe interface having a high interface resistance is preferably used. However, it is difficult to obtain magnetically soft characteristics, which are required for the free layer, by only Fe. Therefore, the magnetically soft characteristics can be improved by adding the ferromagnetic layer FF3 having excellent magnetically soft characteristics, such as NiFe, which is ferromagnetically coupled as a ferromagnetic layer.

When the ferromagnetic layer in the stacked structure of ferromagnetic layer/ferromagnetic layer contains Fe or an Fe base alloy, the ferromagnetic layer preferably has the fcc structure. Because the stacked structure can be more stable when an fcc metal, such as CoFe or NiFe, is stacked and because the stacked structure can have good crystalline properties as a whole to improve magnetically soft characteristics and reduce spin fluctuation. However, the bcc structure can also be used.

As a combination of two kinds of magnetic materials, a magnetic material having the fcc structure can be combined with a magnetic material having the bcc structure. In such a combination, the state of electrons, the shape of the Fermi surface, and the distribution of state density of the fcc magnetic material are greatly different from those of the bcc magnetic material. For that reason, it is possible to obtain a considerable screen effect with respect to conduction electrons, so that it is possible to obtain a high resistance and a high rate of change in MR.

The Fe base alloy is preferably a material, which can easily obtain magnetically soft characteristics, such as Fe, FeNi, FeCo, FeSi, FeMo or FeAl.

The Co containing alloy is an alloy of Co, to which one or more of Fe, Ni, Au, Ag, Cu, Pd, Pt, Ir, Rh, Ru, Os and Hf are added. The amount of the additional element is preferably in the range of from 5 to 50 at %, and more preferably in the range of from 8 to 20 at %. Because there is the possibility that the bulk effect does not sufficiently increase if the amount of the additional element is too small and that the interface effect greatly decreases if the amount of the additional element is too large. In order to obtain a high rate of change in MR, the additional element is preferably Fe.

In the CPP-SV, the scattering of electrons occurs when conductive electrons pass through the pinned layer P and the free layer F. If the pinned layer P or the free layer F is multilayered according to this embodiment, the modulation of band potential based on the staked period of the multilayered structure is carried out. Therefore, the wave number vector of electrons capable of flowing in a direction perpendicular to the plane of the film is restricted in accordance with modulation of band potential. The restricted wave number varies in accordance with the stacking period. Therefore, also in this embodiment similar to the above described case referring to FIGS. 7, 8A and 8B, the wave number of electrons capable of passing through both layers can be greatly restricted by changing the stacking periods in the pinned layer P and free layer F. Since the screen effect itself has the spin dependence effect, it is possible to hold a high spin dependency while maintaining a low transmission probability of electrons as a whole. For that reason, if the stacking periods in the pinned layer P and free layer F are intentionally changed, it is possible to form a CPP-SV capable of realizing a high rate of change in MR while maintaining a higher resistance.

The non-magnetic intermediate layer S is preferably formed of a material, in which the mean free path of conductive electrons is long, such as Cu, Au or Ag. By using such a material, electrons can varistically conduct from the pinned layer P forming an electrode to the free layer F, so that it is possible to more effectively utilize the scattering effect of electrons depending on spin which is caused by the ferromagnetic material. Thus, it is possible to obtain a higher rate of change in MR. Alternatively, the non-magnetic intermediate layer S may be formed of an alloy of the above described three elements. In that case, the composition is preferably adjusted so that the crystal lattice constant in the stacked structure can be adjusted to be the optimum value.

As described above referring to FIG. 10, the non-magnetic intermediate layer S may have the stacked structure of non-magnetic layer/non-magnetic layer wherein a material, such as Cu, Au or Ag, is stacked. In this case, if the stacking period of the stacked structure of non-magnetic layer/non-magnetic layer, and the stacking period of the pinned layer p or the free layer F are suitably set, the wave number vector of electrons capable of flowing through the whole CPP-SV in a direction perpendicular to the plane of the film can be further restricted, so that it is possible to form a CPP-SV capable of realizing a higher resistance and a higher rate of change in MR.

On the other hand, the antiferromagnetic layer A is preferably formed of a metallic antiferromagnetic material having excellent magnetization fixing characteristics. Specifically, an antiferromagnetic material, such as PtMn, NiMn, FeMn or IrMn, may be used. The thickness of the antiferromagnetic layer A is preferably as thin as possible from the standpoint of electric characteristics. However, if the antiferromagnetic layer A is too thin, the magnetization fixing characteristics deteriorate, so that it is required to select such a thickness that the blocking temperature does not decrease. For that reason, the thickness is preferably 5 nm or more.

In addition to the above described construction, a magnetic layer antiferromagnetically coupled to another ferromagnetic layer may be added any one or both of the first magnetic layer p and the second magnetic layer F to form a synthetic antiferromagnetic layer structure as described above referring to FIG. 11. By forming such a synthetic construction, the apparent magnetization can be zero in the pinned layer, so that the magnetization fixing in the pinned layer can be more stable. In addition, by decreasing the apparent magnetization in the free layer, it is possible to obtain a more sensitive response to external magnetic field.

In addition, also in this embodiment similar to the above described embodiment referring to FIG. 12, a buffer layer (underlying layer) B and a protective layer C may be provided. That is, an underlying layer is preferably formed between the electrode EL and the antiferromagnetic layer A for improving smoothness and crystalline properties. In addition, a layer to be a protective layer is preferably arranged between the top electrode EL and the free layer F. The underlying layer and the protective layer are preferably formed of a material having a good wetting property, such as Ta, Ti or Cr, a material having a low electric resistance and a stable fcc structure, such as Cu. Au or Ag, or a stacked structure thereof.

The embodiment of the present invention has been described above.

Referring to Examples, the present invention will be described below in more detail.

EXAMPLE 1

Figure 15:
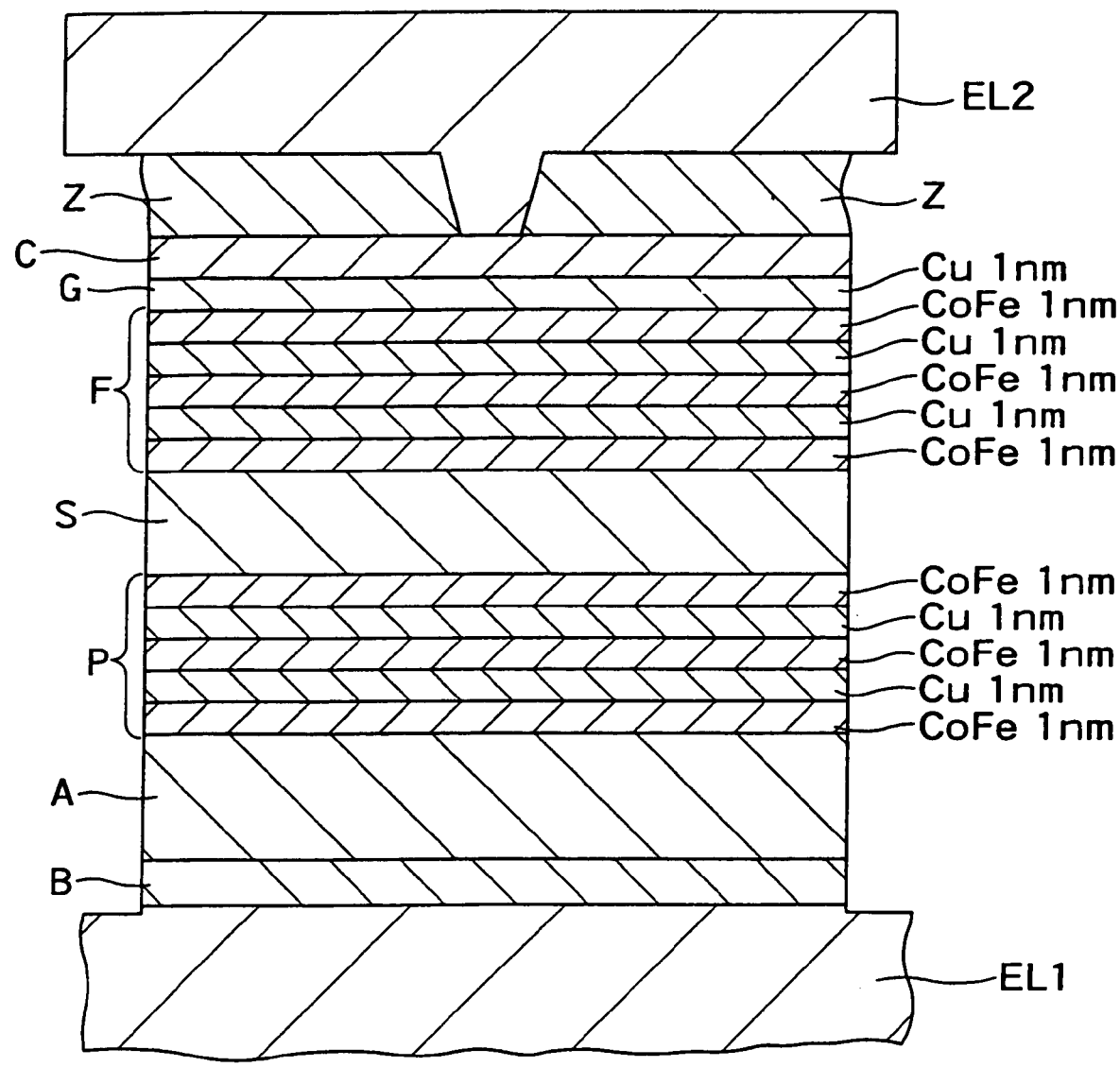
FIG. 15 is a conceptual drawing showing a cross-sectional construction of a first example of a spin-valve element according to an aspect of the present invention.

FIG. 15 is a conceptual drawing showing a cross-sectional construction of a spin-valve element according to a first example of the present invention. A fabricating process in this example will be described below.

First, a Cu bottom electrode EL1 having a thickness of 500 nm was stacked on a thermally oxidized silicon (Si) substrate (not shown) by the sputtering method, and the Cu bottom electrode EL1 was formed so as to have a stripe shape having a width of 9 μm by the photolithography. Then, a CPP-SV 3 μm square was deposited thereon. The stacked construction of the film was as follows.

Ta 5 nm/NiFe 2 nm/PtMn 15 nm/CoFe 1 nm/Cu 1 nm/CoFe 1 nm/Cu 1 nm/CoFe 1 nm/Cu 3 nm/CoFe 1 nm/Cu 1 nm/CoFe 1 nm/Cu 1 nm/CoFe 1 nm/Cu 1 nm/Ta 5 nm

An insulating film Z of AlOx was deposited thereon, and a hole 0.1 μm square was formed in the insulating film Z. Then, a Cu top electrode EL2 having a thickness of 500 nm was stacked thereon by the sputtering method. In this example, with the above described construction, it was possible to measure the characteristics of the CPP-SV via the hole 0.1 μm square of the insulating film Z.

As the results of measurement at room temperatures, the resistance was 5Ω, and it was possible to obtain a rate of change in resistance of 10%. Thus, it was possible to obtain an amount of change in resistance of 0.5Ω. In addition, it was verified that the pinned layer P was suitably magnetization-fixed and that the magnetization of the stacked structure constituting the pinned layer P moved integrally.

It was also verified that Hc of the free layer F was small and its magnetization moved integrally with respect to the external magnetic field.

In addition, a fine through hole was formed in a portion of Ta 5 nm/NiFe 2 nm/PtMn 15 nm constituting the bottom structure of the film structure in this example, to cause the Cu bottom electrode to bond directly to the CoFe/Cu stacked structure, and the size of the hole formed in the insulating film Z was set to be 0.05 μm square. Thus, it was possible to measure MR from which a parasitic resistance caused by the Ta 5 nm/NiFe 2 nm/PtMn 15 nm structure was removed.

As a result, the resistance was 5Ω, and it was possible to obtain a rate of change in resistance of 40%. Thus, it was possible to obtain an amount of change in resistance of 2Ω. In addition, it was verified that the pinned layer P was suitably magnetization-fixed by the antiferromagnetic layer A and that the magnetization of the stacked structure constituting the pinned layer P moved integrally.

COMPARATIVE EXAMPLE 1

As a comparative example to the above described example, a spin-valve element of a CPP type wherein each of a pinned layer and a free layer was a monolayer was fabricated by way of experiment.

First, a Cu bottom electrode EL1 having a thickness of 500 nm was stacked on a thermally oxidized silicon (Si) substrate by the sputtering method, and the Cu bottom electrode EL1 was formed so as to have a stripe shape having a width of 9 μm by the photolithography. Then, a CPP-SV 3 μm square was deposited thereon. The construction of the film was as follows.

Ta 5 nm (buffer layer)/NiFe 2 nm (buffer layer)/PtMn 15 nm (antiferromagnetic layer)/CoFe 3 nm (pinned layer)/Cu 3 nm (non-magnetic intermediate layer)/CoFe 3 nm (free layer)/Cu 1 nm (high conductive layer)/CoFe 5 nm (protective layer)

The same insulating film of AlOx as that shown in FIG. 15 was formed thereon, and a hole 0.1 μm square was formed in AlOx. Then, a Cu top electrode having a thickness of 500 nm was stacked thereon by the sputtering method. In this example, it was possible to measure the characteristics of the CPP-SV via the hole 0.1 μm square of AlOx. As the results of measurement at room temperatures, the resistance was 3Ω, and the rate of change in resistance was only 2%. Therefore, the amount of change in resistance was only 0.06Ω, so that the amount of change was only about ⅛ as large as that in Example 1.

COMPARATIVE EXAMPLE 2

As a second comparative example, a spin-valve element of a CPP type wherein a sense current was caused to flow in a direction parallel to the plane of the film was fabricated by way of experiment.

First, the same stacked structure as that in the first comparative example was formed on a thermally oxidized silicon (Si) substrate by the sputtering method.

Ta 5 nm (buffer layer)/NiFe 2 nm (buffer layer)/PtMn 15 nm (antiferromagnetic layer)/CoFe 3 nm (pinned layer)/Cu 3 nm (non-magnetic intermediate layer)/CoFe 3 nm (free layer)/Cu 1 nm (high conductive layer)/Ta 5 nm (protective layer)

Then, electrodes were formed on both end portions of the stacked film, and a sense current was caused to flow in a direction parallel to the plane of the film to measure a rate of change in MR. As a result, the rate of change in MR was 8%.

Then, a CIP type spin-valve element having the stacked structure of a pinned layer and a free layer was fabricated by way of experiment. The stacked structure was as follows.

Ta 5 nm (buffer layer)/NiFe 2 nm (buffer layer)/PtMn 15 nm (antiferromagnetic layer)/CoFe 1 nm (pinned layer)/Co 1 nm (pinned layer)/CoFe 1 nm (pinned layer)/Cu 1 nm (pinned layer)/CoFe 1 nm (pinned layer)/Cu 3 nm (non-magnetic intermediate layer)/CoFe 1 nm (free layer)/Cu 1 nm (free layer)/CoFe 1 nm (free layer)/Cu 1 nm (free layer)/CoFe 1 nm (free layer)/Cu 1 nm (high conductive layer)/Ta 5 nm (protective layer)

This stacked structure was deposited to measure a rate of change in MR. As a result, the rate of change in MR was 9%. That is, although the rate of change in MR was increased as compared with Comparative Example 1, the increased rate was only a small value.

From the results of the above described comparative examples, it was revealed that it was not so effective that the pinned layer and the free layer in the CIP type SV element had the multilayer structure of the ferromagnetic layers and the non-magnetic layers.

EXAMPLE 2

As a second example of the present invention, a CPP type spin-valve element having an Fe/Au type stacked structure will be described below.

First, a Cu bottom electrode having a thickness of 500 nm was stacked on a thermally oxidized silicon (Si) substrate by the sputtering method, and the Cu bottom electrode was formed so as to have a stripe shape having a width of 9 μm by the photolithography. Then, a CPP-SV 3 μm square was deposited thereon. The stacked construction of the film was as follows.

Ta 5 nm (buffer layer)/NiFe 2 nm (buffer layer)/PtMn 15 nm (antiferromagnetic layer)/Fe 1 nm (pinned layer)/Au 1 nm (pinned layer)/Fe 1 nm (pinned layer)/Au 1 nm (pinned layer)/Fe 1 nm (pinned layer)/Au 3 nm (non-magnetic intermediate layer)/Fe 1 nm (free layer)/Au 1 nm (free layer)/Fe 1 nm (free layer)/Au 1 nm (free layer)/Fe 1 nm (free layer)/Au 1 nm (high conductive layer)/Ta 5 nm (protective layer)

As shown in FIG. 15, an insulating film of AlOx was formed thereon, and a hole 0.1 μm square was formed in AlOx. Then, a Cu top electrode having a thickness of 500 nm was stacked thereon by the sputtering method. In this example, with the above described construction, it was possible to measure the characteristics of the CPP-SV via the hole 0.1 μm square of AlOx. As the results of measurement at room temperatures, the resistance was 8Ω, and it was possible to obtain a rate of change in resistance of 20%. Thus, it was possible to obtain an amount of change in resistance of 1.6Ω.

In addition, it was verified that the pinned layer was suitably magnetization-fixed by the antiferromagnetic layer and that the magnetization of the pin stacked structure moved integrally.

It was also verified that, although Hc of the free layer F was a large value of 20 Oe, the magnetization moved integrally with respect to the external magnetic field.

In addition, a fine through hole was formed in a portion of Ta 5 nm/NiFe 2 nm/PtMn 15 nm constituting the bottom structure of the film structure in this example, to cause the Cu bottom electrode to bond directly to the CoFe/Cu stacked structure, and the size of the hole formed in the insulating film Z was set to be 0.05 μm square. Thus, it was possible to measure MR from which a parasitic resistance caused by the Ta 5 nm/NiFe 2 nm/PtMn 15 nm structure was removed.

As a result, the resistance was 12Ω, and it was possible to obtain a rate of change in resistance of 40%. Thus, it was possible to obtain an amount of change in resistance of 2Ω. In addition, it was verified that the pinned layer P was suitably magnetization-fixed by the antiferromagnetic layer A and that the magnetization of the stacked structure constituting the pinned layer P moved integrally.

EXAMPLE 3

As a third example of the present invention, a CPP type spin-valve element which has an Fe/Au type stacked structure and which is provided with an NiFe layer on a free layer to improve magnetically soft characteristics will be described below.

First, a Cu bottom electrode having a thickness of 500 nm was stacked on a thermally oxidized silicon (Si) substrate by the sputtering method, and the Cu bottom electrode was formed so as to have a stripe shape having a width of 9 μm by the photolithography. Then, a CPP-SV 3 μm square was deposited thereon. The construction of the film was as follows.

Ta 5 nm (buffer layer)/NiFe 2 nm (buffer layer)/PtMn 15 nm (antiferromagnetic layer)/Fe 1 nm (pinned layer)/Au 1 nm (pinned layer)/Fe 1 nm (pinned layer)/Au 1 nm (pinned layer)/Fe 1 nm (pinned layer)/Au 3 nm (non-magnetic intermediate layer)/Fe 1 nm (free layer)/Au 1 nm (free layer)/Fe 1 nm (free layer)/Au 1 nm (free layer)/NiFe 2 nm (free layer)/Ta 5 nm (protective layer)

As shown in FIG. 15, an insulating film of AlOx was formed thereon, and a hole 0.1 μm square was formed in AlOx. Then, a Cu top electrode having a thickness of 500 nm was stacked thereon by the sputtering method. Also in this example, with the above described construction, it was possible to measure the characteristics of the CPP-SV via the hole 0.1 μm square of AlOx.

As the results of measurement at room temperatures, the resistance was 7Ω, and it was possible to obtain a rate of change in resistance of 18%. Thus, it was possible to obtain an amount of change in resistance of 1.26Ω.

In addition, it was verified that the pinned layer was suitably magnetization-fixed by the antiferromagnetic layer and that the magnetization of the pin stacked structure moved integrally.

It was also verified that it was possible to decrease Hc of the free layer to 18 Oe and that the magnetization moved integrally with respect to the external magnetic field.

In addition, a fine through hole was formed in a portion of Ta 5 nm/NiFe 2 nm/PtMn 15 nm constituting the bottom structure of the film structure in this example, to cause the Cu bottom electrode to bond directly to the CoFe/Cu stacked structure, and the size of the hole formed in the insulating film Z was set to be 0.05 μm square. Thus, it was possible to measure MR from which a parasitic resistance caused by the Ta 5 nm/NiFe 2 nm/PtMn 15 nm structure was removed.

As a result, the resistance was 10Ω, and it was possible to obtain a rate of change in resistance of 40%. Thus, it was possible to obtain an amount of change in resistance of 4.0Ω. In addition, it was verified that the pinned layer P was suitably magnetization-fixed by the antiferromagnetic layer A and that the magnetization of the stacked structure constituting the pinned layer P moved integrally.

EXAMPLE 4

First, a Cu bottom electrode having a thickness of 500 nm was stacked on a thermally oxidized silicon (Si) substrate by the sputtering method, and the Cu bottom electrode was formed so as to have a stripe shape having a width of 9 μm by the photolithography. Then, a CPP-SV 3 μm square was deposited thereon. The construction of the film was as follows.

Ta 5 nm (buffer layer)/NiFe 2 nm (buffer layer)/PtMn 15 nm (antiferromagnetic layer)/Fe 0.5 nm (pinned layer)/CoFe 0.5 nm (pinned layer)/Fe 0.5 nm (pinned layer)/Au 1 nm (pinned layer)/Fe 0.5 nm (pinned layer)/CoFe 0.5 nm (pinned layer)/Fe 0.5 nm (pinned layer)/Au 3 nm (pinned layer)/Fe 0.5 nm (free layer)/CoFe 0.5 nm (free layer)/Fe 0.5 nm (free layer)/Au 1 nm (free layer)/Fe 0.5 nm (free layer)/CoFe 0.5 nm (free layer)/Fe 0.5 nm (pinned layer)/Au 1 nm (free layer)/NiFe 2 nm (free layer)/Ta 5 nm (protective layer)

As shown in FIG. 15, an insulating film of AlOx was formed thereon, and a hole 0.1 μm square was formed in AlOx. Then, a Cu top electrode having a thickness of 500 nm was stacked thereon by the sputtering method. In this example, with the above described construction, it was possible to measure the characteristics of the CPP-SV via the hole 0.1 μm square of AlOx.

As the results of measurement at room temperatures, the resistance was 9Ω, and it was possible to obtain a rate of change in resistance of 27%. Thus, it was possible to obtain an amount of change in resistance of 2.5Ω.

In addition, it was verified that the pinned layer was suitably magnetization-fixed and that the magnetization of the pin stacked structure moved integrally. It was also verified that it was possible to decrease Hc of the free layer to 8 Oe, and that the magnetization moved integrally with respect to the external magnetic field.

In addition, a fine through hole was formed in a portion of Ta 5 nm/NiFe 2 nm/PtMn 15 nm constituting the bottom structure of the film structure in this example, to cause the Cu bottom electrode to bond directly to the CoFe/Cu stacked structure, and the size of the hole formed in the insulating film Z was set to be 0.05 μm square. Thus, it was possible to measure MR from which a parasitic resistance caused by the Ta 5 nm/NiFe 2 nm/PtMn 15 nm structure was removed.

As a result, the resistance was 20Ω, and it was possible to obtain a rate of change in resistance of 40%. Thus, it was possible to obtain an amount of change in resistance of 8Ω. In addition, it was verified that the pinned layer P was suitably magnetization-fixed by the antiferromagnetic layer A and that the magnetization of the stacked structure constituting the pinned layer P moved integrally.

EXAMPLE 5

First, a Cu bottom electrode having a thickness of 500 nm was stacked on a thermally oxidized silicon (Si) substrate by the sputtering method, and the Cu bottom electrode was formed so as to have a stripe shape having a width of 9 μm by the photolithography. Then, a CPP-SV 3 μm square was deposited thereon. The construction of the film was as follows.

Ta 5 nm (buffer layer)/NiFe 2 nm (buffer layer)/PtMn 15 nm (antiferromagnetic layer)/Fe 1 nm (pinned layer)/CoFe 1 nm (pinned layer)/Fe 1 nm (pinned layer)/CoFe 1 nm (pinned layer)/Fe 1 nm (pinned layer)/Au 3 nm (non-magnetic intermediate layer)/Fe 1 nm (free layer)/CoFe 1 nm (free layer)/Fe 1 nm (free layer)/CoFe 1 nm (free layer)/NiFe 2 nm (free layer)/Ta 5 nm (protective layer)

As shown in FIG. 15, an insulating film of AlOx was formed thereon, and a hole 0.1 μm square was formed in AlOx. Then, a Cu top electrode having a thickness of 500 nm was stacked thereon by the sputtering method. In this example, with the above described construction, it was possible to measure the characteristics of the CPP-SV via the hole 0.1 μm square of AlOx.

As the results of measurement at room temperatures, the resistance was 6Ω, and it was possible to obtain a rate of change in resistance of 16%. Thus, it was possible to obtain an amount of change in resistance of 0.96Ω.

In addition, it was verified that the pinned layer was suitably magnetization-fixed and that the magnetization of the pin stacked structure moved integrally.

It was also verified that it was possible to decrease Hc of the free layer to 8 Oe and that the magnetization moved integrally with respect to the external magnetic field.

In addition, a fine through hole was formed in a portion of Ta 5 nm/NiFe 2 nm/PtMn 15 nm constituting the bottom structure of the film structure in this example, to cause the Cu bottom electrode to bond directly to the CoFe/Cu stacked structure, and the size of the hole formed in the insulating film Z was set to be 0.05 μm square. Thus, it was possible to measure MR from which a parasitic resistance caused by the Ta 5 nm/NiFe 2 nm/PtMn 15 nm structure was removed.

As a result, the resistance was 8Ω, and it was possible to obtain a rate of change in resistance of 40%. Thus, it was possible to obtain an amount of change in resistance of 3.2Ω. In addition, it was verified that the pinned layer P was suitably magnetization-fixed by the antiferromagnetic layer A and that the magnetization of the stacked structure constituting the pinned layer P moved integrally.

Third Embodiment

As a third embodiment of the present invention, a magnetic head using a magnetoresistance effect element according to an aspect of the present invention will be described below.

Figure 16:
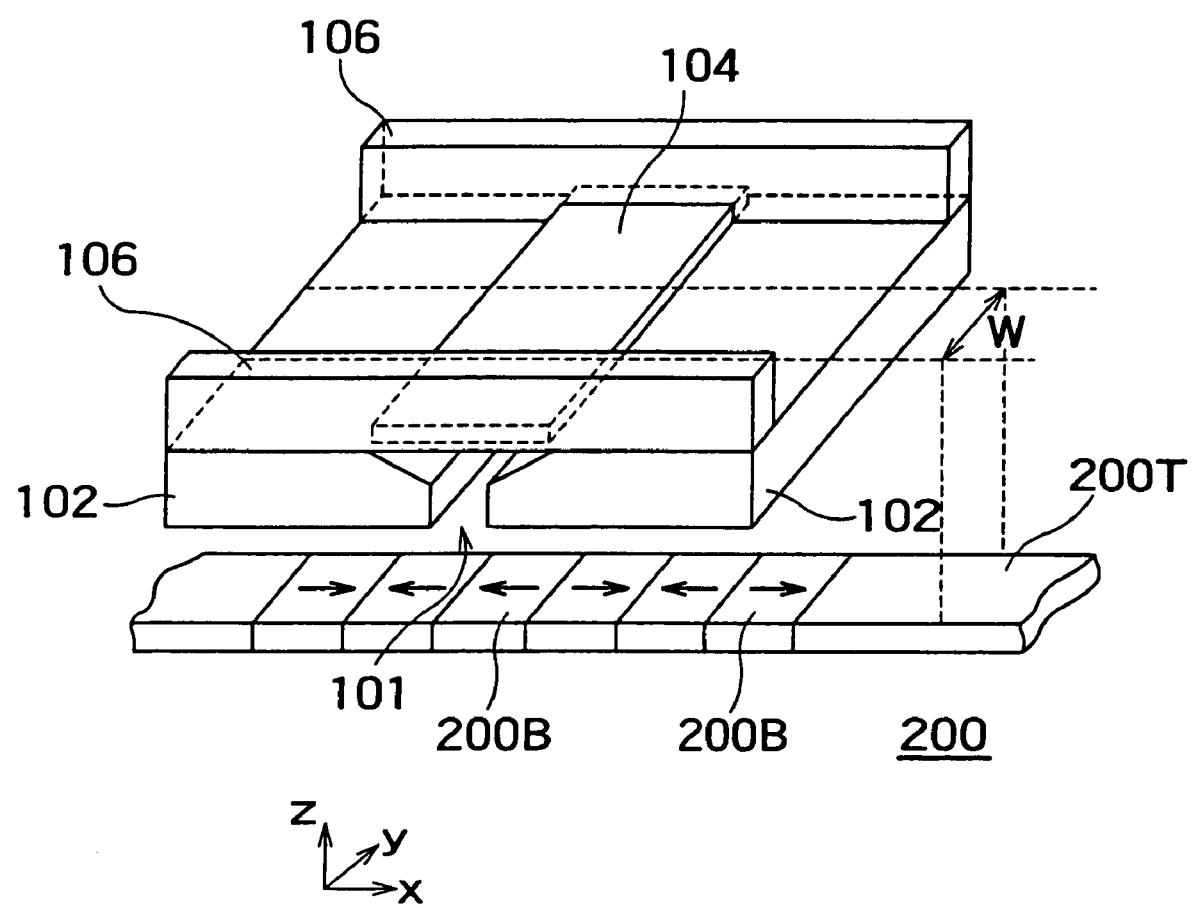
FIG. 16 is a schematic perspective view of a magnetic head including a magnetoresistance effect element according to an aspect of the present invention.

FIG. 16 is a schematic perspective view of a principal part of a magnetic head using a magnetoresistance effect element according to an aspect of the present invention. That is, the magnetic head according to another aspect of the present invention has a pair of magnetic yokes 102, 102 which are arranged so as to face a recording medium 200. On the magnetic yokes 102, 102, a magnetoresistance effect element 104 magnetically coupled thereto is provided. The magnetoresistance effect element 104 is any one of the CPP type elements according to an aspect of the present invention, which have bee described above referring to FIGS. 1 through 15. On both sides thereof, a pair of bias layers 106, 106 are formed so as to straddle the pair of magnetic yokes 102, 102. The bias layers 106 are made of an antiferromagnetic or ferromagnetic material, and have the function of directing the magnetization of the magnetic yoke 102 and the free layer of the magnetoresistance effect element 104 to a direction perpendicular to a recording magnetic field, i.e., to the y direction in the figure.

In the recording medium 200, a recording track 200 T is formed, and recording bits 200B are arranged. In each of the recording bits 200B, a signal magnetization illustrated by arrow is formed. The signal magnetic flux from these recording bits is given to a magnetic circuit which connects the magnetic yokes 102 to the magnetoresistance effect element 104. If the magnetic field of the recording bit 200B is given to the magnetoresistance effect element 104, the magnetization of the free layer rotates on the plane from the y direction due to the bias layer 106. Then, the variation in magnetizing direction is detected as the variation in magnetic resistance.

In order to match the magnetic detection region of the magnetoresistance effect element to the size of the recording bit 200B, the contact of the electrode of the magnetoresistance effect element 104 is formed so as to be limited to a region corresponding to a recording track width W shown in the figure.

According to the embodiment of the present invention, any one of the CPP type elements described above referring to FIGS. 1 through 15 is used as the magnetoresistance effect element 104, so that it is possible to obtain both an appropriate element resistance and a large variation in magnetic resistance. That is, it is possible to realize a magnetic head having a greatly higher sensitive and more stable reliability than those of conventional heads.

While the magnetic head suitable for magnetic recording media of a longitudinal (in-plane) recording system has been described in this example, the present invention should not be limited thereto. The magnetoresistance effect element according to the present invention may be applied to a magnetic head suitable for vertical recording media, to obtain the same effects.

Fourth Embodiment

As a fourth embodiment of the present invention, a magnetic recording and/or reproducing system using a magnetoresistance effect element according to embodiments of the present invention will be described below. Any one of the magnetoresistance effect elements according to embodiments of the present invention, which have been described above referring to FIGS. 1 through 15, can be mounted on a magnetic head illustrated in FIG. 16, and can be incorporated in, e.g., a recording/reproducing integral type magnetic head assembly, to be applied to a magnetic recording and/or reproducing system.

Figure 17:
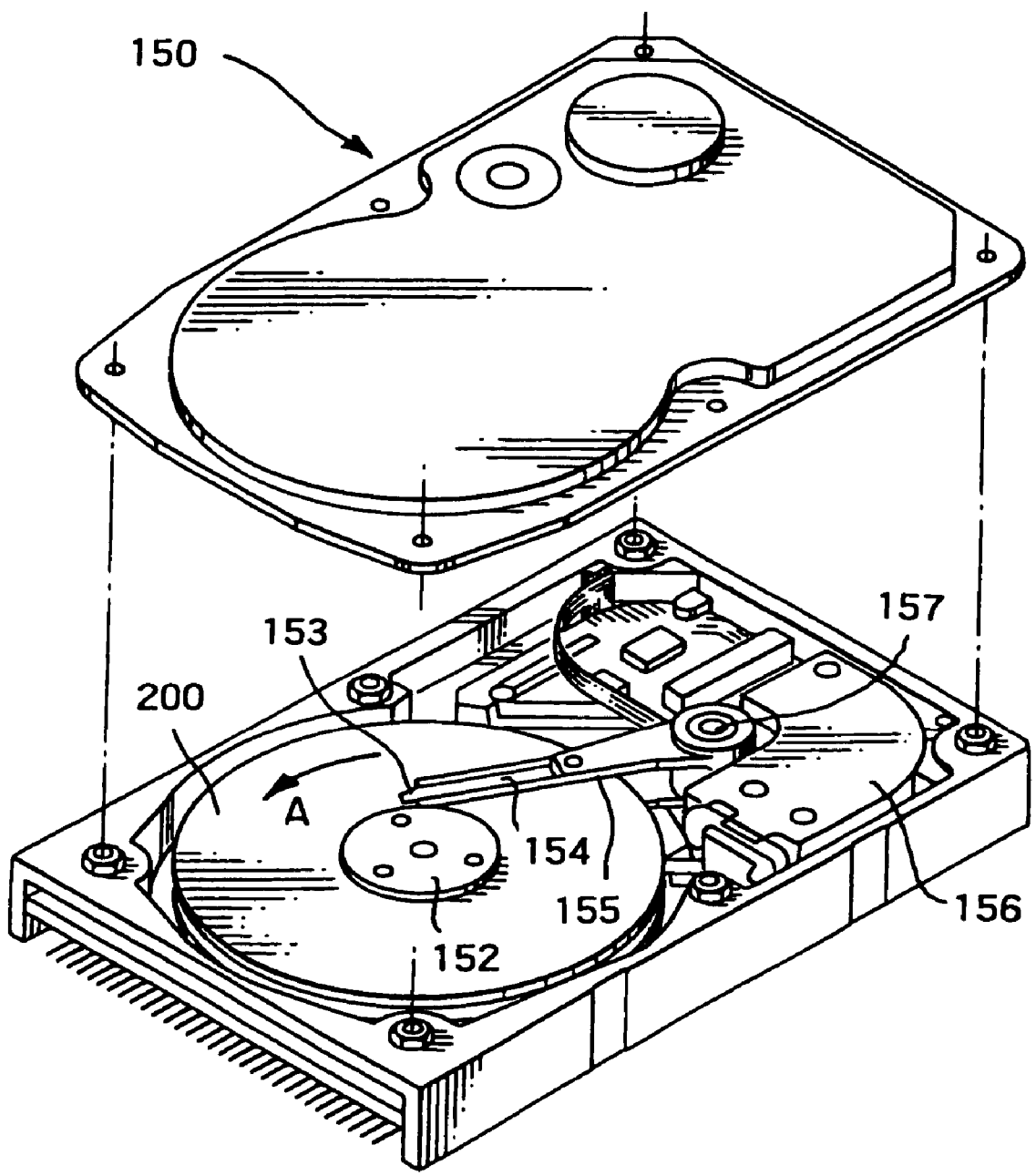
FIG. 17 is a perspective view of a principal part illustrating a schematic construction of a magnetic recording and/or reproducing system according to another aspect of the present invention.

FIG. 17 is a perspective view illustrating a schematic construction of a principal part of such a magnetic recording and/or reproducing system. That is, a magnetic recording and/or reproducing system 150 according to an aspect of the present invention is a system of a type using a rotary actuator. In this figure, a longitudinal recording or vertical recording magnetic disk 200 is mounted on a spindle 152, and is rotated in a direction of arrow A by means of a motor (not shown) which responds to a control signal from a drive unit control part (not shown). A head slider 153 for recording/reproducing information to be stored in the magnetic disk 200 is mounted on the tip of a thin-film-like suspension 154. For example, a magnetic head including any one of the magnetoresistance effect elements according to the present invention, which have been described in Example 6, is provided in the vicinity of the tip of the head slider 153.

If the magnetic disk 200 rotates, the medium facing surface or air bearing surface (ABS) of the head slider 153 is held at a predetermined flying height from the surface of the magnetic disk 200.

The suspension 154 is connected to one end of an actuator arm 155 which has a bobbin portion or the like for holding a driving coil (not shown). On the other hand of the actuator arm 155, a voice coil motor 156 which is a kind of a linear motor is provided. The voice coil motor 156 comprises: a driving coil (not shown) wound onto the bobbin portion of the actuator arm 155; and a magnetic circuit comprising permanent magnets, which are arranged so as to face each other via the coil, and facing yokes.

The actuator arm 155 is held by two ball bearings (not shown) which are provided above and below a fixing shaft 157, and is rotatable and slidable by means of the voice coil motor 156.

Figure 18:
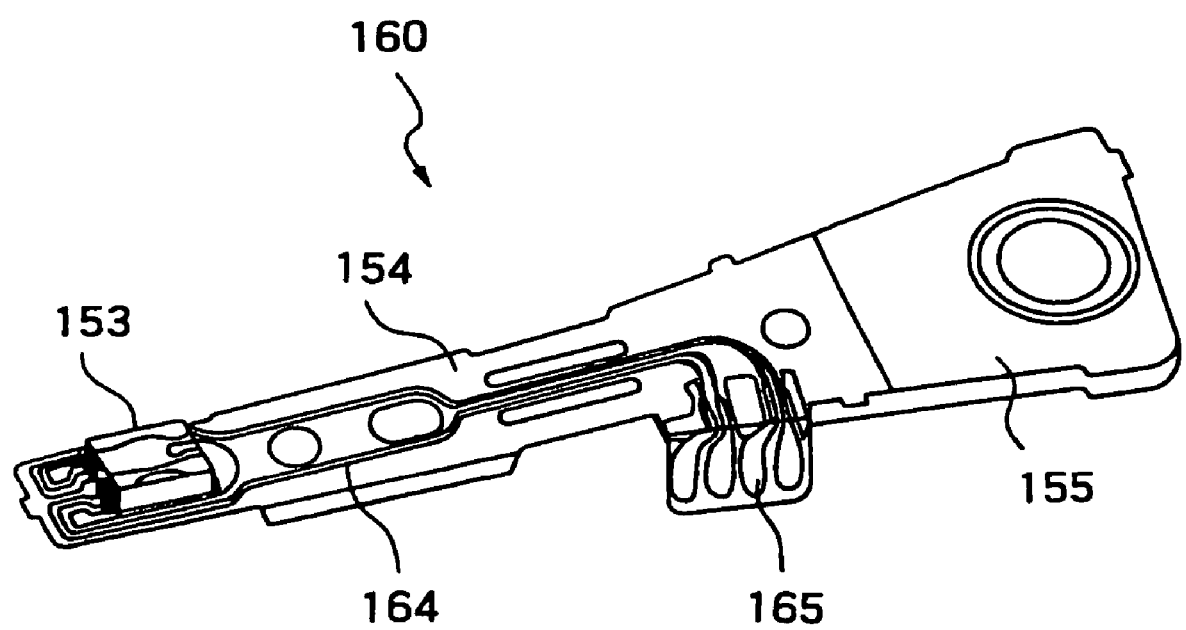
FIG. 18 is an enlarged perspective view of a magnetic head assembly in front of an actuator arm 155, viewed from the side of a disk.
Figure 19:
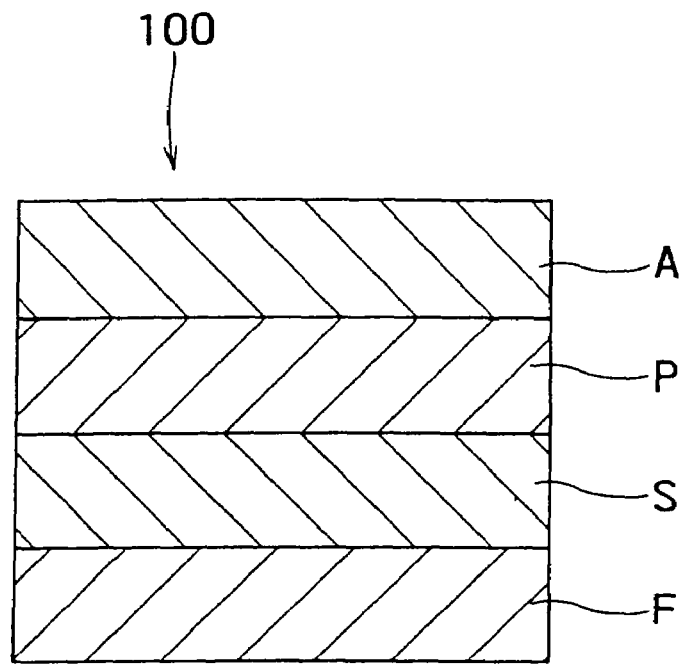
FIG. 19 is a conceptual drawing illustrating a schematic cross-sectional structure of a spin-valve film.

FIG. 18 is an enlarged perspective view of a magnetic head assembly in front of an actuator arm 155, which is viewed from the side of a disk. That is, the magnetic head assembly 160 has an actuator arm 151 having, e.g., a bobbin portion or the like for holding a driving coil, and a suspension 154 is connected to one end of the actuator arm 155.

A head slider 153 having a reproducing magnetic head using a magnetoresistance effect element according to embodiments of the present invention is mounted on the tip of the suspension 154. A recording head may be combined. The suspension 154 has a lead wire 164 for writing and reading signals. This lead wire 164 is electrically connected to each electrode of the magnetic head which is incorporated in the head slider 153. In the figure, reference number 165 denotes an electrode pad of the magnetic head assembly 160.

Between the medium facing surface or air bearing surface (ABS) of the head slider 153 and the surface of the magnetic disk 200, a predetermined flying height is set.

The slider 153 including the magnetic head 10 operates while flying at a predetermined height from the surface of the magnetic disk 200. According to an aspect of the present invention, such a "flying traveling type" magnetic recording and/or reproducing system can also reproduce at low noises with a higher resolution than conventional systems.

On the other hand, of course, a "contact traveling type" magnetic recording and/or reproducing system for traveling the slider while positively causing the magnetic head 10 to contact the magnetic disk 200 can also reproduce at low noises with a higher resolution than conventional systems.

Referring to Examples, the embodiments of the present invention have been described. However, the present invention should not be limited to these examples.

For example, with respect to the structure of the spin-valve element and the materials of the respective layers, the present invention may be similarly applied to all embodiments, which can be selected by persons with ordinary skill in the art, to provide the same effects. For example, the present invention can be similarly applied to a "dual type" structure.

In addition, the structure of the magnetic head, the materials and shapes of the respective elements constituting the magnetic head should not be limited to those described above in Examples, but the present invention may be similarly applied to all embodiments, which can be selected by persons with ordinary skill in the art, to provide the same effects.

The magnetic recording and/or reproducing system may be a reproducing only system or a recording and/or reproducing system. In addition, the medium should not be limited to a hard disk, but it may be any one of all magnetic recording media, such as flexible disks and magnetic cards. Moreover, the magnetic recording and/or reproducing system may be a so-called "removable" type system wherein a magnetic recording medium is removed from the system.

As described above, according to the present invention, it is possible to provide a magnetoresistance effect element which has an appropriate value of resistance and a large amount of change in MR and which is magnetically sensitive.

As a result, it is possible to surely read magnetic information from a finer recording bit from that in conventional elements, so that it is possible to greatly improve the packing density of a recording medium. Simultaneously, the reliability of the magnetic recording and/or reproducing system is improved due to thermal stability, and the utilized scope thereof is extended, so that there is a great industrial merit.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistance effect element comprising:
a magnetization fixed layer in which a direction of magnetization is substantially fixed to one direction, the magnetization fixed layer having a first stacked body including first and second ferromagnetic films, the first and second ferromagnetic films in the first stacked body being ferromagnetically coupled to each other in the first stacked body;
a magnetization free layer in which a direction of magnetization varies in response to an external magnetic field, the magnetization free layer having a second stacked body including third and fourth ferromagnetic films, the third and fourth ferromagnetic films in the second stacked body being ferromagnetically coupled to each other in the second stacked body;
a non-magnetic intermediate layer provided between the magnetization fixed layer and the magnetization free layer;
a high conductive layer provided on a surface of the magnetization free layer opposite from the non-magnetic intermediate layer, the high conductive layer having a higher conductivity than those of the magnetization fixed layer and the magnetization free layer;
a resistance of the magnetoresistance effect element varying in accordance with a relative angle between the direction of magnetization of the magnetization fixed layer and the direction of magnetization of the magnetization free layer; and
a sense current flowing to the magnetization fixed layer, the non-magnetic intermediate layer and the magnetization free layer in a direction substantially perpendicular to surfaces of those layers.

2. The magnetoresistance effect element as set forth in claim 1, further comprising an antiferromagnetic layer provided on a surface of the magnetization fixed layer opposite from the non-magnetic intermediate layer, and the antiferromagnetic layer fixing the magnetization of the magnetization fixed layer.

3. The magnetoresistance effect element as set forth in claim 1, wherein the first to fourth ferromagnetic films include any one of an iron (Fe) base alloy, a cobalt (Co) base alloy and a nickel (Ni) base alloy.

4. The magnetoresistance effect element as set forth in claim 1, wherein the first stacked body is any one of NiFe alloy/CoFe alloy, Fe base alloy/NiFe alloy, and Fe base alloy/Cope alloy and the second stacked body is any one of NiFe alloy/CoFe alloy, Fe base alloy/NiFe alloy, and Fe base alloy/CoFe alloy.

5. A magnetic head comprising a magnetoresistance effect element, the magnetoresistance effect element including:
a magnetization fixed layer in which a direction of magnetization is substantially fixed to one direction, the magnetization fixed layer having a first stacked body including first and second ferromagnetic films, the first and second ferromagnetic films in the first stacked body being ferromagnetically coupled to each other in the first stacked body;
a magnetization free layer in which a direction of magnetization varies in response to an external magnetic field, the magnetization free layer having a second stacked body including third and fourth ferromagnetic films, the third and fourth ferromagnetic films in the second stacked body being ferromagnetically coupled to each other in the second stacked body;
a non-magnetic intermediate layer provided between the magnetization fixed layer and the magnetization free layer;
a high conductive layer provided on a surface of the magnetization free layer opposite from the non-magnetic intermediate layer, the high conductive layer having a higher conductivity than those of the magnetization fixed layer and the magnetization free layer;
a resistance of the magnetoresistance effect element varying in accordance with a relative angle between the direction of magnetization of the magnetization fixed layer and the direction of magnetization of the magnetization free layer; and
a sense current flowing to the magnetization fixed layer, the non-magnetic intermediate layer and the magnetization free layer in a direction substantially perpendicular to surfaces of those layers.

6. A magnetic recording and/or reproducing system comprising a magnetic head having a magnetoresistance effect element, the magnetoresistance effect element including:
a magnetization fixed layer in which a direction of magnetization is substantially fixed to one direction, the magnetization fixed layer having a first stacked body including first and second ferromagnetic films, the first and second ferromagnetic films in the first stacked body being ferromagnetically coupled to each other in the first stacked body;
a magnetization free layer in which a direction of magnetization varies in response to an external magnetic field, the magnetization free layer having a second stacked body including third and fourth ferromagnetic films, the third and fourth ferromagnetic films in the second stacked body being ferromagnetically coupled to each other in the second stacked body;

a non-magnetic intermediate layer provided between the magnetization fixed layer and the magnetization free layer;

a high conductive layer provided on a surface of the magnetization free layer opposite from the non-magnetic intermediate layer, the high conductive layer having a higher conductivity than those of the magnetization fixed layer and the magnetization free layer;

a resistance of the magnetoresistance effect element varying in accordance with a relative angle between the direction of magnetization of the magnetization fixed layer and the direction of magnetization of the magnetization free layer; and a sense current flowing to the magnetization fixed layer, the non-magnetic intermediate layer and the magnetization free layer in a direction substantially perpendicular to surfaces of those layers.

* * * * *